United States Patent
Mori

(10) Patent No.: US 7,785,954 B2
(45) Date of Patent: Aug. 31, 2010

(54) SEMICONDUCTOR MEMORY INTEGRATED CIRCUIT AND ITS MANUFACTURING METHOD

(75) Inventor: Seiichi Mori, Ota-Ku (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 12/630,499

(22) Filed: Dec. 3, 2009

(65) Prior Publication Data

US 2010/0081266 A1 Apr. 1, 2010

Related U.S. Application Data

(60) Continuation of application No. 11/484,743, filed on Jul. 12, 2006, now abandoned, which is a division of application No. 11/258,193, filed on Oct. 26, 2005, now Pat. No. 7,118,963, which is a division of application No. 10/938,514, filed on Sep. 13, 2004, now Pat. No. 6,989,303, which is a division of application No. 09/876,019, filed on Jun. 8, 2001, now Pat. No. 6,794,708.

(30) Foreign Application Priority Data

| Jun. 9, 2000 | (JP) | ............................. 2000-174127 |
| Jun. 6, 2001 | (JP) | ............................. 2001-171612 |

(51) Int. Cl.
  *H01L 21/336* (2006.01)
(52) U.S. Cl. ................. 438/201; 438/257; 438/593; 257/E21.179
(58) Field of Classification Search ............... 438/201, 438/211, 257, 593; 257/E21.179
  See application file for complete search history.

(56) References Cited

U.S. PATENT DOCUMENTS 5,688,705 A * 11/1997 Bergemont ................. 438/588
5,994,733 A   11/1999 Nishioka et al.

(Continued)

FOREIGN PATENT DOCUMENTS

JP          7-302853          11/1995

(Continued)

*Primary Examiner*—Thanhha Pham
(74) *Attorney, Agent, or Firm*—Oblon, Spivak, McClelland, Maier & Neustadt, L.L.P.

(57) ABSTRACT

A method of manufacturing a semiconductor memory integrated circuit intended to improve properties and reliability of its peripheral circuit includes the step of forming a tunnel oxide film (21*a*) in the cell array region, gate oxide film (21*b*) for a high-voltage circuit and gate oxide film (21*c*) for a low-voltage circuit both in the peripheral circuit to respectively optimum values of thickness, and covering them with a first-layer polycrystalline silicon film (22). After that, device isolation grooves (13) are formed and buried with a device isolation insulating film (14). The first-layer polycrystalline silicon film (24) is a non-doped film, and after device isolation, a second-layer polycrystalline silicon film (24) is doped with phosphorus in the cell array region to form floating gates made of the first-layer polycrystalline silicon film (22) and the second-layer polycrystalline silicon film (24). In the peripheral circuit, gate electrodes are made of a multi-layered film including the first-layer polycrystalline silicon, film (22), second-layer polycrystalline silicon film (24) and third-layer polycrystalline silicon film 28, and impurities are ion implanted thereafter to respective transistor regions under respectively optimum conditions.

12 Claims, 41 Drawing Sheets

U.S. PATENT DOCUMENTS

| | | |
|---|---|---|
| 6,104,059 A | 8/2000 | Ono |
| 6,159,799 A | 12/2000 | Yu |
| 6,281,050 B1 | 8/2001 | Sakagami |
| 6,287,907 B1 | 9/2001 | Ito et al. |
| 6,342,715 B1 | 1/2002 | Shimizu et al. |
| 6,403,421 B1 | 6/2002 | Ikeda et al. |
| 6,417,051 B1 | 7/2002 | Takebuchi |
| 6,420,223 B2 | 7/2002 | Camerlenghi |
| 6,441,426 B1 | 8/2002 | Fukumoto et al. |
| 6,486,508 B1 | 11/2002 | Lee |

FOREIGN PATENT DOCUMENTS

| | | |
|---|---|---|
| JP | 11-26731 | 1/1999 |
| JP | 11-31799 | 2/1999 |
| WO | WO 98/44567 | 10/1998 |

* cited by examiner

SEMICONDUCTOR MEMORY INTEGRATED CIRCUIT AND ITS MANUFACTURING METHOD

CROSS REFERENCE TO RELATED APPLICATION

This application is a continuation of and claims the benefit of priority under 35 USC §120 from U.S. Ser. No. 11/484, 743, filed Jul. 12, 2006, which is a division of U.S. Pat. No. 7,118,963, issued Oct. 10, 2006, which is a division of U.S. Pat. No. 6,989,303, issued Jan. 24, 2006, which is a division of U.S. Pat. No. 6,794,708, issued Sep. 21, 2004, and is based upon and claims the benefit of priority under 35 USC §119 from the prior Japanese Patent Application No. 2000-174127, filed Jun. 9, 2000 and Japanese Patent Application No. 2001-171612, filed Jun. 6, 2001; the entire contents of which are incorporated herein by reference.

BACKGROUND OF THE INVENTION

1. Field of the Invention

This invention relates to a semiconductor memory integrated circuit made up of a cell array with an arrangement of electrically erasable and programmable nonvolatile memory cells and a transistor circuit disposed around the cell array (peripheral circuit), and a manufacturing method of the semiconductor memory integrated circuit.

2. Description of the Related Art

Memory cells of EEPROM flash memory has a transistor structure including stacked floating gates and control gates. The floating gate of such a memory cell is commonly made of a polycrystalline silicon film doped with phosphorus to an adequate concentration. Phosphorus concentration of the floating gate affects the quality of an underlying tunnel insulating film and the configuration of the floating gate itself by post thermal oxidation. Since the quality of the tunnel insulating film and the floating gate configuration significantly influence the property and reliability of the memory cell, they need be properly controlled independently from other parameters.

On the other hand, the transistor circuit disposed around the cell array (hereinbelow simply called peripheral circuit) is made by using a CMOS structure at least in a logic circuit. To ensure that transistors of the peripheral circuit exert their performance required as surface channel type transistors, it is necessary to dope a p-type impurity {typically boron) into gate electrodes in case of MOS transistors or an n-type impurity (typically arsenic) into gate electrodes in case of NMOS transistors. Additionally, to prevent depletion of gates, a doped amount not less than a predetermined concentration and activation of the impurity are indispensable.

Taking account of these requirements for such a cell array and its peripheral circuit, for conventional flash memory, the following manufacturing process is used. FIGS. 35(a) through 35(d) show major steps noticing the cell array region. As shown in FIG. 35 (a), a silicon substrate 1, having formed a tunnel oxide layer 2 thereon and a polycrystalline silicon film 3a on the tunnel oxide layer 2, is separated into respective device regions by STI (shallow trench isolation) technology. That is, device isolation grooves 4 are made by RIE, and they are buried with a device isolation insulation film 5 as shown in FIG. 35. The polycrystalline silicon film 3a will serve as a base layer of floating gates.

This method of first stacking the polycrystalline Si film as a part of the floating gates and thereafter making a groove-like device isolation regions into the Si substrate is a technique very effective for miniaturizing memory cells while alleviating variance of electrical properties of the memory cells. The method of making floating gates after making the device isolation regions is liable to be affected by concentration of an electric field near the device isolation regions, and also liable to invite variance in the amount of capacitance coupling between the floating gates and the Si substrate. To prevent these problems, the use of a process unsuitable for miniaturizing memory cells is compelled.

Next stacked is a polycrystalline silicon film 3b which will form an upper layer of the floating gates. Let the polycrystalline silicon film 3b be doped with phosphorus. As a result, in a later thermal step, phosphorus diffuses from the polycrystalline silicon film 3b into the underlying polycrystalline silicon film 3a, and it results in uniformly doping the impurity into the floating gates in form of a multi-layered film. At that time, doping of a proper concentration of phosphorus will round corners of the floating concentration of the electric field to edges of the floating gates during write and erase operations.

Excessively high phosphorus concentration of the floating gates will adversely affect the tunnel oxide film 2 under the floating gates. Excessively low phosphorus concentration will leave lower corners of the floating gates square, and will invite concentration of the electric field. This will cause variance and deterioration in reliability of write, erase and other properties of the memory cells. Therefore, proper control of the phosphorus concentration in the floating gates is important for flash memory. If arsenic is used as the impurity of the floating gates, corner rounding by thermal oxidation is not expected unlike the use of phosphorus, and phosphorus is used preferably.

After the step of FIG. 35(C), the polycrystalline silicon film 3b is selectively etched to separate the film of the floating gates into cell regions, and thereafter, a gate insulation film 6 is formed and a polycrystalline silicon film 7 is stacked to form control gates. Commonly used as the gate insulating film 6 is a composite film (ONO film) of oxide/nitride/oxide layers.

Next directing to the peripheral circuit, in the status where the gate insulating film 6 is formed in the cell array region, in the peripheral circuit region, the gate insulating film is removed by etching, the polycrystalline silicon films 3a, 3b are also removed, and the tunnel oxide film is removed as well. Then, after an appropriate gate oxide film is formed to comply with a resistance to pressure necessary for the respective transistor regions, a polycrystalline silicon film 7 used as control gates in the cell array region will be stacked. That is, by patterning the polycrystalline silicon film 7, control gates in the cell array region and gated electrodes of transistors in the peripheral circuit are formed simultaneously.

After the control gates of the cell array and gate electrodes of the peripheral circuit are made, an n-type impurity is ion-implanted into the cell array region and the NMOS transistor regions of the peripheral circuit, and a p-type impurity is additionally ion-implanted into the PMOS transistor regions of the peripheral circuit. As a result, source and drain diffusion layers of the cell array region and the peripheral circuit region are formed, the n-type impurity is doped into the control gates of the cell array region and the gate electrodes of the NMOS transistor in the peripheral circuit, and the p-type impurity is doped into the gate electrodes of the PMOS transistor in the peripheral circuit.

In the conventional process reviewed above, in the peripheral circuit region the tunnel oxide film formed over both the peripheral circuit region and the cell array region needs to be removed, newly forming a gate oxide film for high-voltage circuit transistors, then the gate oxide film is selectively removed by etching and thereafter a gate oxide film is formed for low-voltage circuit transistors. Repeating such etching steps of oxide films several times causes, in the peripheral circuit region, retraction of the device isolation insulating film already buried. FIG. 36(a) shows an aspect of such retraction. If the gate oxide film 8 is formed as shown in FIG. 36(b) on the structure shown in FIG. 36(a) to make gate electrodes 9, edge portions of the gate electrodes 9 enter into the concave portions of the device isolation insulating film in contact with side 7 surfaces of device regions as shown by the broken line A.

Configuration as shown in FIG. 36(b) invites a short-channel effect opposite to a normal short-channel effect (opposite short-channel effect), in which the threshold value lowers when the peripheral circuit transistors are short-channeled. Also invited are an increase of the leak current of the peripheral circuit transistors, deterioration of their sub-threshold characteristics and, hence, increase of the standby current in the peripheral circuit. Further, deterioration of the reliability of the gate insulating film at end portions of the gate electrodes is also invited.

SUMMARY OF THE INVENTION

It is therefore an object of the invention to provide a semiconductor memory integrated circuit and its manufacturing method that improve property and reliability of a peripheral circuit.

According to one aspect of the invention, there is provided a semiconductor memory integrated circuit comprising:

a semiconductor substrate;

a device isolation insulating film buried in grooves formed into the semiconductor substrate;

a cell array having an arrangement of electrically erasable and programmable nonvolatile memory cells made by stacking floating gates and control gates on the semiconductor substrate; and a peripheral circuit disposed around the cell array on the semiconductor substrate, at least the bottom layer of the floating gates of the nonvolatile memory cells and at least the bottom layer of gate electrodes of transistors in the peripheral circuit being stacked before the device isolation insulating film is buried, then being maintained in self alignment with the device isolation insulating film, and impurities being doped thereto under different conditions from each other.

According to another aspect of the invention, there is provided a method of manufacturing a semiconductor memory integrated circuit comprising the steps of:

forming a plurality of gate insulating films each having a thickness required for each of a cell array region and a peripheral circuit region on a semiconductor substrate;

stacking a first-layer gate electrode material film not doped with impurities on the gate insulating films;

etching the semiconductor substrate covered with the first-layer gate electrode material film to make grooves for device isolation, and burying the device isolation grooves with a device isolation insulating film;

stacking a second-layer gate electrode material film not doped with impurities on the first-layer gate electrode material film maintained in self alignment with regions surrounded by the device isolation insulating film and on the device isolation insulating film;

selectively introducing impurities into the first-layer and second-layer gate electrode material films in the cell array region;

selectively etching the second-layer gate electrode material film to separate the same on the device isolating insulating film in the cell array region;

forming a gate insulating film on the second-layer gate electrode material film to serve as an insulation film between floating gates and control gates of memory cells;

removing the gate insulating film from the peripheral circuit region;

stacking a third-layer gate electrode material film not doped with impurities on the gate insulating film;

processing the gate electrode material in the memory cell region and the peripheral circuit region into a desired pattern to form control gate and floating gates in the memory cell region and form gate electrodes in the peripheral circuit region; and forming source and drain diffusion layers and lowering the resistance of the gate electrodes by introducing impurities into the memory cell region and the peripheral circuit region under a plurality of different conditions.

In the manufacturing method described above, as far as the cell array region is concerned, floating gates can be also made solely of the first-layer gate electrode material film without stacking the second-layer gate electrode material film.

According to a further aspect of the invention, there is provided a method of manufacturing a semiconductor memory integrated circuit comprising the steps of:

forming a plurality of gate insulating film each having a thickness required for each of a cell array region and a peripheral circuit region on a semiconductor substrate;

stacking a first-layer gate electrode material film not doped with impurities on the gate insulating films;

etching the semiconductor substrate covered with the first-layer gate electrode material film to make grooves for device isolation, and burying the device isolation grooves with a device isolation insulating film;

stacking a second-layer gate electrode material film not doped with impurities on the first-layer gate electrode material film maintained in self alignment with regions surrounded by the device isolation insulating film and on the device isolation insulating film;

selectively introducing impurities into the first-layer and second-layer gate electrode material films in the cell array region;

selectively etching the second-layer gate electrode material film to separate the same on the device isolating insulating film in the cell array region;

forming a gate insulating film on the second-layer gate electrode material film to serve as an insulation film between floating gates and control gates of memory cells;

stacking a third-layer gate electrode material film on the gate insulating film;

removing the third-layer gate electrode material film from the peripheral circuit region;

processing the gate electrode material in the memory cell region and the peripheral circuit region into a desired pattern to form control gates and floating gates in the memory cell region and form gate electrodes in the peripheral circuit region; and forming source and drain diffusion layers and lowering the resistance of the gate electrodes by introducing impurities into the memory cell region and the peripheral circuit region under a plurality of different conditions.

According to a still further aspect of the invention, there is provided a method of manufacturing a semiconductor memory integrated circuit comprising the steps of:

forming a plurality of gate insulating films each having a thickness required for each of a cell array region and a peripheral circuit region on a semiconductor substrate;

stacking a first-layer gate electrode material film not doped with impurities on the gate insulating films;

selectively etching the semiconductor substrate covered with the first-layer gate electrode material film to form device isolation grooves, and burying the device isolation grooves with a device isolation insulating film;

forming a barrier film on the device isolation insulating film and the first-layer gate electrode material film maintained in self-alignment in regions surrounded by the device isolation insulating film to prevent diffusion of impurities;

selectively removing the barrier film from above the cell array region;

stacking on the entire surface a second-layer gate electrode material film doped with impurity;

selectively etching the second-layer gate electrode material film to remove the second-layer gate electrode material film from above the device isolation insulation film within the cell array region, and removing the second-layer gate electrode material film from the peripheral circuit region;

stacking a third-layer gate electrode material film not doped with impurities on the cell array region having the gate insulating film selectively formed on the second-layer gate electrode material film and on the peripheral circuit region from which the barrier film has been removed;

selectively etching the first-layer and third-layer gate electrode material films to form control gates and floating gates in the cell array region and gate electrodes in the peripheral circuit region; and forming source and drain diffusion layers and lowering the resistance of the gate electrodes by introducing impurities into the memory cell region and the peripheral circuit region under a plurality of different conditions.

According to a yet further aspect of the invention, there is provided a method of manufacturing a semiconductor memory integrated circuit comprising the steps of:

forming a plurality of gate insulating films each having a thickness required for each of a cell array region and a peripheral circuit region on a semiconductor substrate;

stacking a first-layer gate electrode material film not doped with impurities on the gate insulating films;

selectively etching the semiconductor substrate covered with the first-layer gate electrode material film to form device isolation grooves, and burying the device isolation grooves with a device isolation insulating film;

doping an impurity into the first-layer gate electrode material film on the cell array region;

etching the entire surface of the device isolation insulating film projecting upward to a level exposing side surfaces of the first-layer gate electrode material film;

forming a gate insulating film to cover the first-layer gate electrode material film;

stacking a second-layer gate electrode material film over the entire surface;

selectively etching the first-layer and second-layer gate electrode material films to form control gates and floating gates in the cell array region and gate electrodes in the peripheral circuit region; and forming source and drain diffusion layers and lowering the resistance of the gate electrodes by introducing impurities into the cell array region and the peripheral circuit region under a plurality of different conditions.

According to a yet further aspect of the invention, there is provided a method of manufacturing a semiconductor memory integrated circuit comprising the steps of:

forming a plurality of gate insulating films each having a thickness required for each of a cell array region and a peripheral circuit region on a semiconductor substrate;

stacking a first-layer gate electrode material film not doped with impurities on the gate insulating films;

selectively etching the semiconductor substrate covered with the first-layer gate electrode material film to form device isolation grooves, and burying the device isolation grooves with a device isolation insulating film;

forming a barrier film on the device isolation insulating film and the first-layer gate electrode material film maintained in self-alignment in regions surrounded by the device isolation insulating film to prevent diffusion of impurities;

selectively removing the barrier film from above the cell array region;

stacking on the entire surface a second-layer gate electrode material film doped with impurity;

removing the entire surface of the second-layer, gate electrode material film to the level of and exposing the top surface of the device isolation insulating film in the cell array region;

removing the second-layer gate electrode material film from the peripheral circuit region;

etching the entire surface of the device isolation insulating film projecting upward to a level exposing side surfaces of the first-layer gate electrode material, film;

forming a gate insulating film to cover the second-layer gate electrode material film on the cell array region;

stacking a third-layer gate electrode material film on the entire surface;

selectively etching the first-layer to third-layer gate electrode material films to form control gates and floating gates in the cell array region and gate electrodes in the peripheral circuit region; and forming source and drain diffusion layers and lowering the resistance of the gate electrodes by introducing impurities into the cell array region and the peripheral circuit region under a plurality of different conditions.

The present invention ensures impurity doping individually optimum for floating gates and control gates of memory cells, and gate electrodes of the peripheral circuit. In addition, at least the bottom layer of gate electrodes in the cell array region and the peripheral circuit region is stacked before the device isolation insulating film is buried, and remains in self-alignment with the device isolation insulating film. Therefore, unlike the process of making gate insulating films different in thickness through a plurality of etching steps of oxide films after burying the device isolation insulating film, here is prevented retraction of the device isolation insulating film in the peripheral circuit region, and property and reliability of the peripheral circuit transistors can be improved.

DESCRIPTION OF THE PREFERRED EMBODIMENTS

Embodiments of the invention will be explained below with reference to the drawings.

First Embodiment

Figure 1:
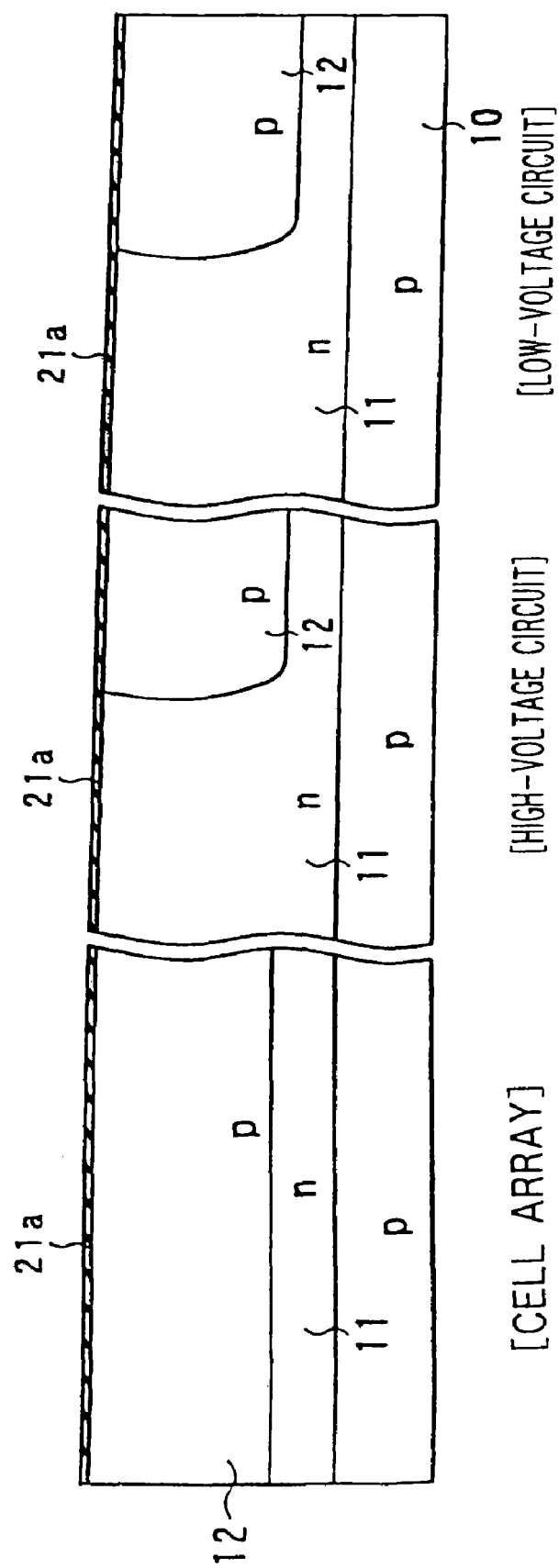
FIG. 1 is cross-sectional view that illustrates a step of making a tunnel insulating film of flash memory according to the first embodiment of the invention.

FIGS. 1 through 13 show a manufacturing process of flash memory according to an embodiment of the invention. In this embodiment, as shown in FIG. 1, n-type wells 11 and p-type wells 12 necessary for respective circuit regions of a silicon substrate 10 are formed before isolation into devices. In addition, in this embodiment, a plurality of gate insulating films having different values of thickness necessary for respective circuit regions are made before STI (Shallow Trench isolation) formation into devices.

Figure 2:
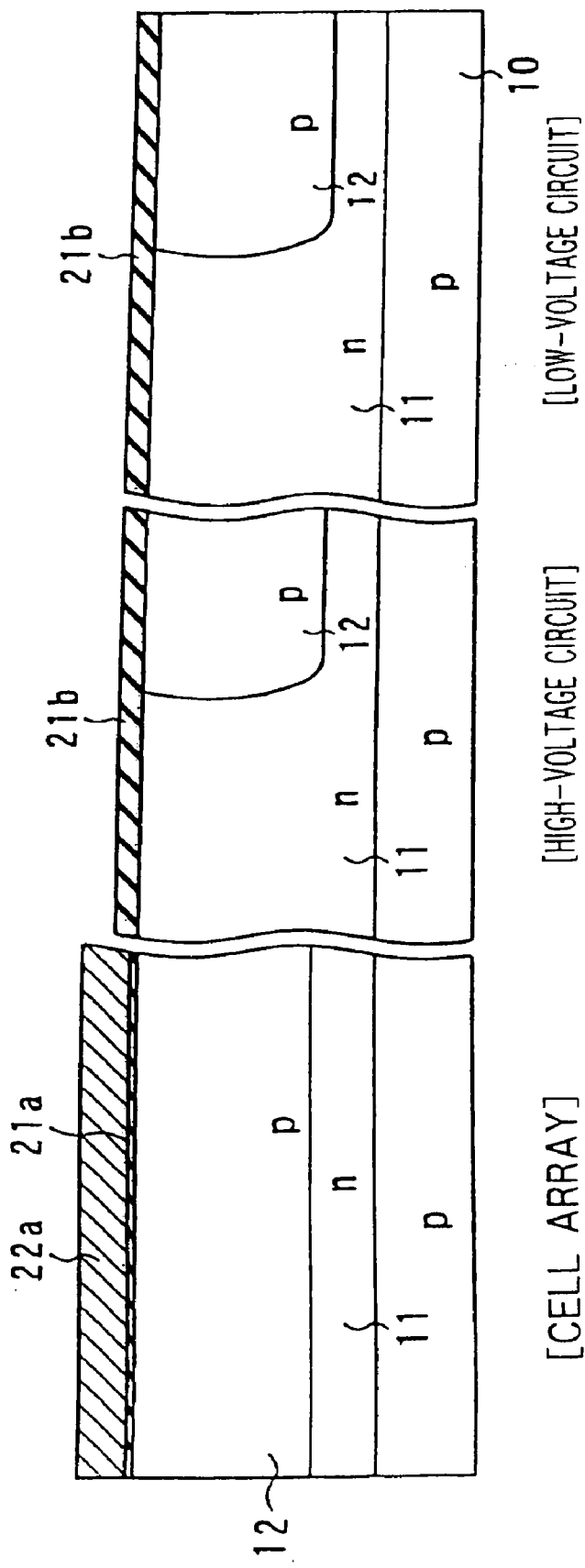
FIG. 2 is a cross-sectional view that illustrates a step of making a gate insulating film of a high-voltage circuit in the first embodiment.

For example, as shown in FIG. 1, a tunnel oxide film 21a is first made as a gate insulating film of a thickness around 8 nm necessary for the cell array region. Since tunnel oxide films, in general, may need nitrification, they are first formed and undergo necessary processing. After that, as shown in FIG. 2, a polycrystalline silicon film 22a is stacked, and then selectively removed by etching to remain only in the cell array region. The polycrystalline silicon film 22a is not doped with impurities, and will form the bottom layer of floating gates in the cell array region. While protecting the cell array region with the polycrystalline silicon film 22a, thermal oxidation is conducted to form a gate oxide film 21b necessary for a high-voltage circuit in the peripheral circuit region. Thereafter, ion implantation is conducted in the peripheral circuit region for controlling the channel impurity concentration.

Figure 3:
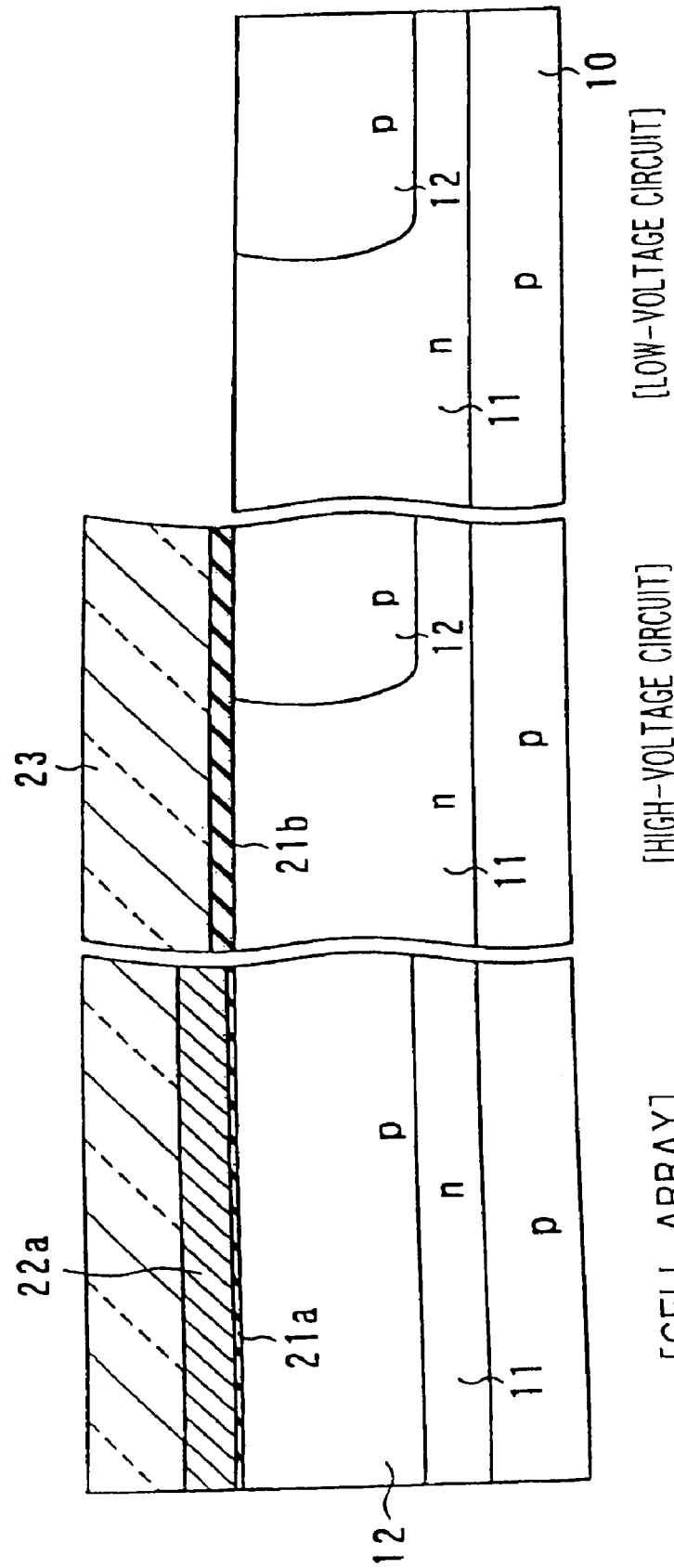
FIG. 3 is a cross-sectional view that shows a step of selectively removing a gate insulating film of a low-voltage circuit in the first embodiment.
Figure 4:
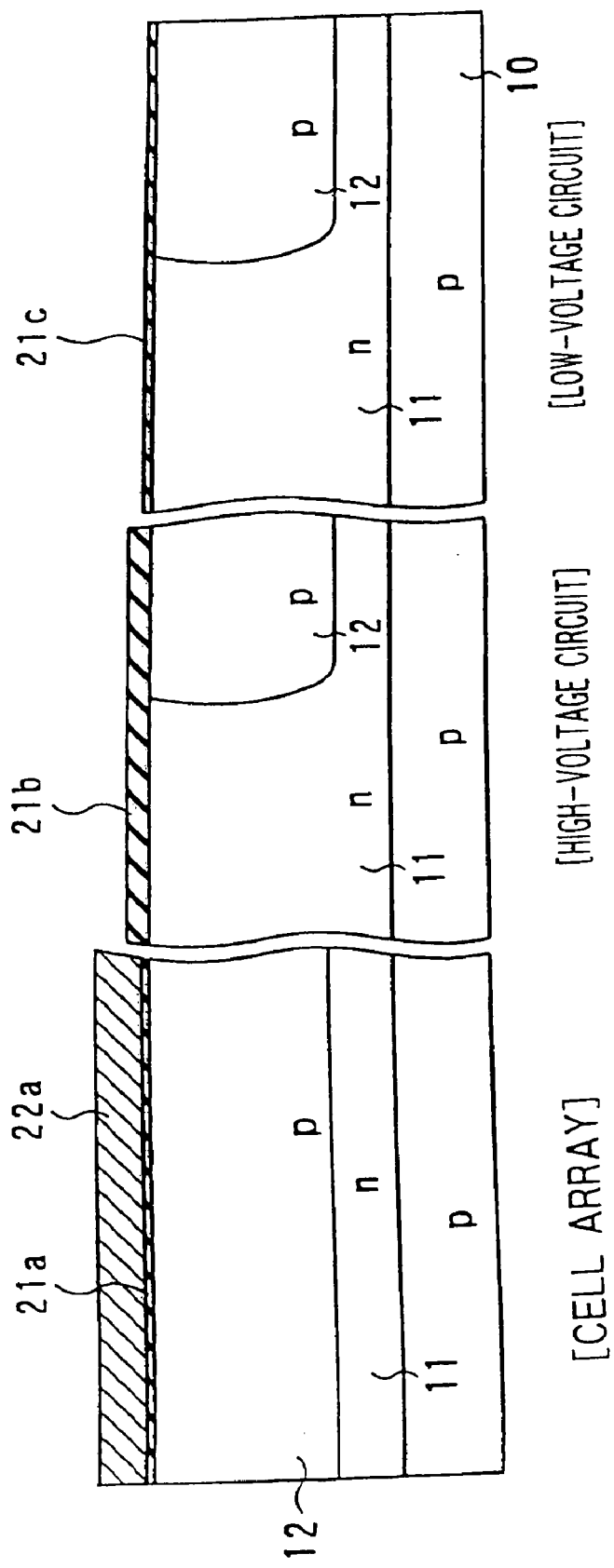
FIG. 4 is a cross-sectional view that illustrates a step of making the gate insulating film of the low-voltage circuit in the first embodiment.

Subsequently, as shown in FIG. 3, the cell array region and the high-voltage circuit region in the peripheral circuit region are covered with a resist 23, for example, and the gate insulating film 21b is selectively removed by etching from a low-voltage circuit region in the peripheral circuit region. Thereafter, thermal oxidation is conducted to form a gate oxide film 21c required in the low-voltage circuit region as shown in FIG. 4. For example, if the gate oxide film 21b of the high-voltage circuit requires the thickness of 17 nm, it is initially made to be approximately 14 nm thick. If the gate oxide film 21c of the low-voltage circuit is formed to a thickness around 8 nm, during this oxidation process, thickness of the gate oxide film 21b of the high-voltage circuit is increased to about 17 nm.

Figure 5:
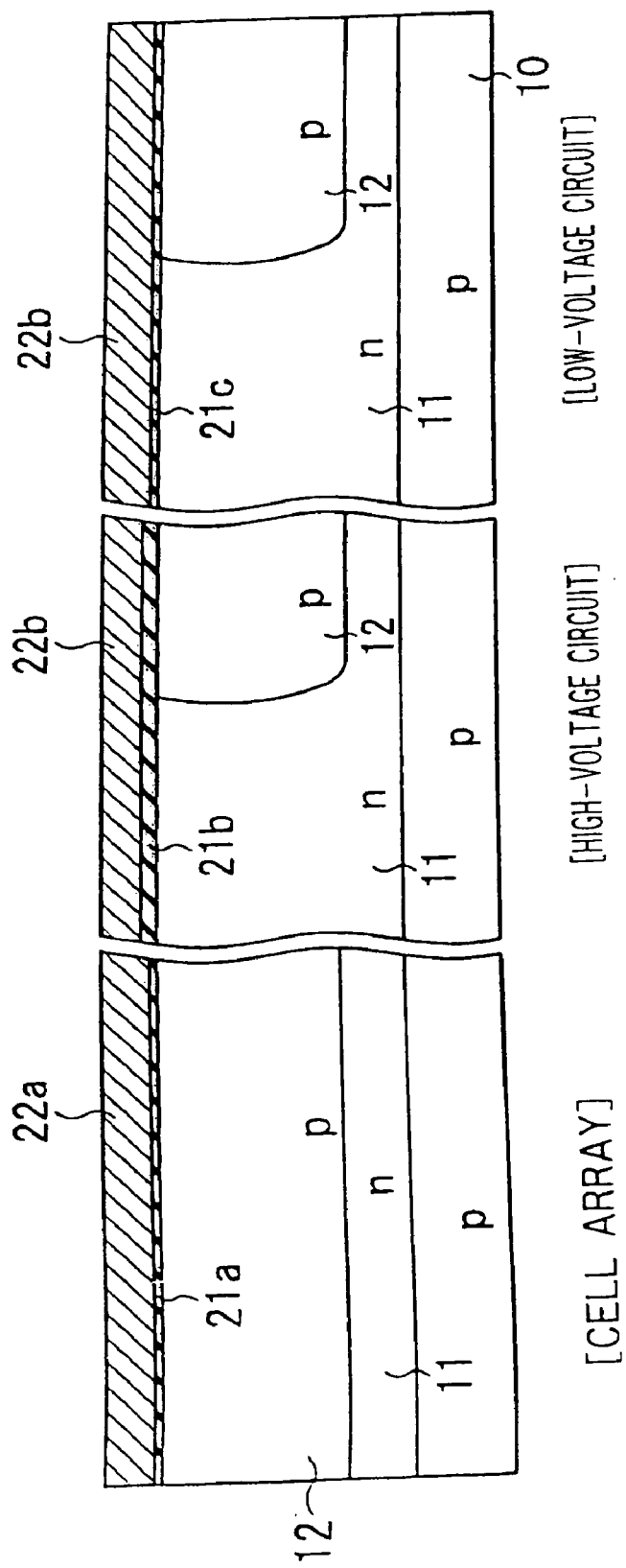
FIG. 5 is a diagram illustrating that individual circuit regions in the first embodiment are covered with a first-layer polycrystalline silicon film.

After that, a polycrystalline silicon film 22b is stacked as shown in FIG. 5. The polycrystalline silicon film 22b will become the bottom layer of gate electrodes in the peripheral circuit region, and let it be not doped with impurities in this stage. This polycrystalline silicon film 22b is stacked also on the polycrystalline silicon film 22a in the cell array region; however, this is removed from there. Thus obtained is the structure as shown in FIG. 5, having respectively necessary gate oxide films 21a, 21b and 21c formed in the respective circuit regions, and covered with the non-doped polycrystalline silicon films 22a, 22b. Heretofore, although two-layered polycrystalline silicon films 22a, 22b are used, they will form the bottom layers of floating gates in the cell array region and gate electrodes in the peripheral circuit region, respectively, and they are hereinbelow collectively referred to as a first-layer polycrystalline silicon film.

An object of the invention lies in entrainment of a high-performance peripheral circuit in flash memory, a difference will be produced in controllability of the impurity profile, depending upon which of steps ion implantation is conducted in for controlling channel impurity profiles of transistors in the peripheral circuit. The method of injecting it at the stage explained in the foregoing embodiment is an example. In another example, ions may be implanted through the polycrystalline silicon film 22 after obtaining the configuration of FIG. 5. Any of these examples, impurity diffusion in channel regions in the peripheral circuit can be decreased in thermal and oxidation steps as compared with a method in which all ion implantation is previously conducted to the tunnel oxide film of FIG. 1, and performance of peripheral circuit transistors is enhanced.

The foregoing steps up to that of FIG. 5 can be modified by, for example, adding some steps like a step of protecting the surface of the polycrystalline silicon film 22a with a nitride film.

Figure 6:
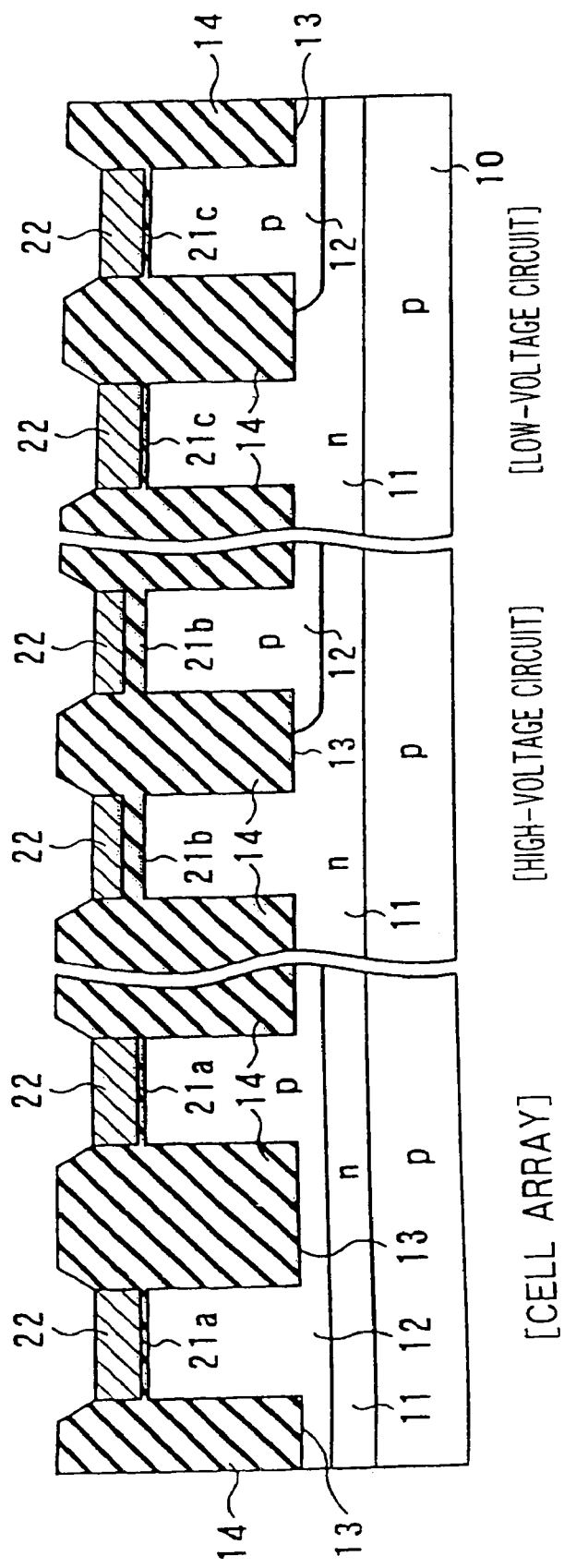
FIG. 6 is a cross-sectional view that shows a step of burying a device isolation insulating film in the first embodiment.

After that, as show in FIG. 6, device isolation grooves 13 are made by RIE, and buried with device isolation insulating film 14. In this device isolation step, for example, a mask in form of a multi-layered film of silicon nitride film and a silicon oxide film (not shown) stacked on the first-layer polycrystalline silicon film 22 is used, and it is removed after the structure is smoothed by burying the device isolation insulating film 14. As a result, as shown in FIG. 6, the first-layer polycrystalline silicon film 22 is divided into respective memory cell regions and transistor regions in a self-aligned manner with the device isolation regions.

Figure 7:
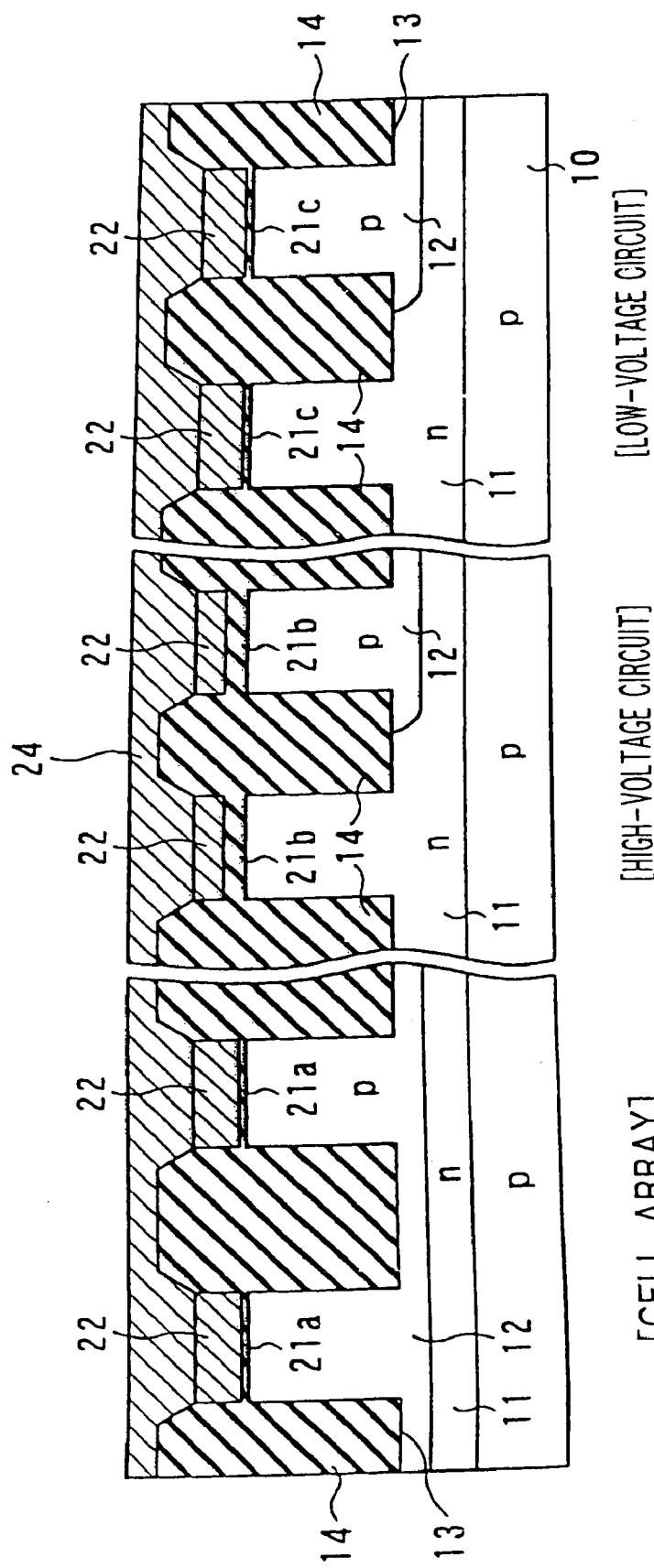
FIG. 7 is a cross-sectional view that shows a step of stacking a second-layer polycrystalline silicon film in the first embodiment.
Figure 8:
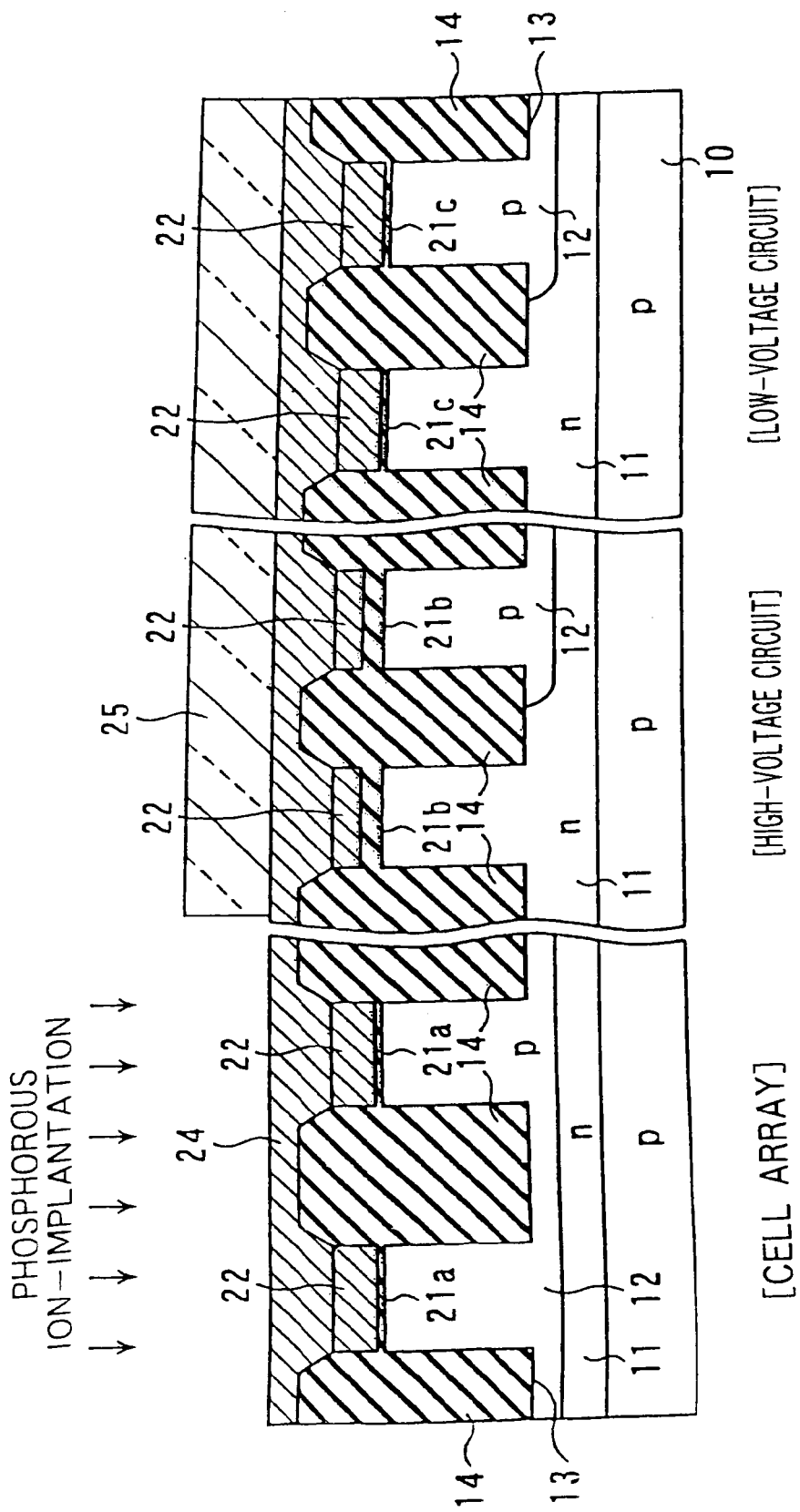
FIG. 8 is a cross-sectional view that shows a step of ion-implanting an impurity into a cell array region in the first embodiment.

After that, as shown in FIG. 7, a second-layer polycrystalline silicon film 24 is stacked. This second-layer polycrystalline silicon film 24 is also non-doped. Then, as show in FIG. 8, a resist 25 is having an aperture in the cell array region is formed by patterning, then phosphorus is ion-implanted into the second-layer polycrystalline silicon film 24 in the cell array region and later diffused to the first-layer polycrystalline silicon film 22. At that time, ion-implanting conditions are adjusted such that impurity concentrations of the first-layer polycrystalline silicon film 22 and the second-layer polycrystalline silicon film 24 become relatively high concentrations in the first half of 1020/cm3.

However, phosphorus introduced by ion implantation to a high concentration is liable to cause channeling, and might damage the tunnel oxide film or penetrate into the underlying substrate, thereby to affect the control of the threshold value. In addition, ion implantation might result in driving metal or other impurity into the floating gates, which will invite abnormal leakage through the tunneling oxide film or degradation of reliability of a gate insulating film that will be formed later around the floating gates. Therefore, particular attention has to be paid to acceleration voltage and other conditions for ion implantation. A method of overcoming these problems will be explained later with another embodiment.

Figure 9:
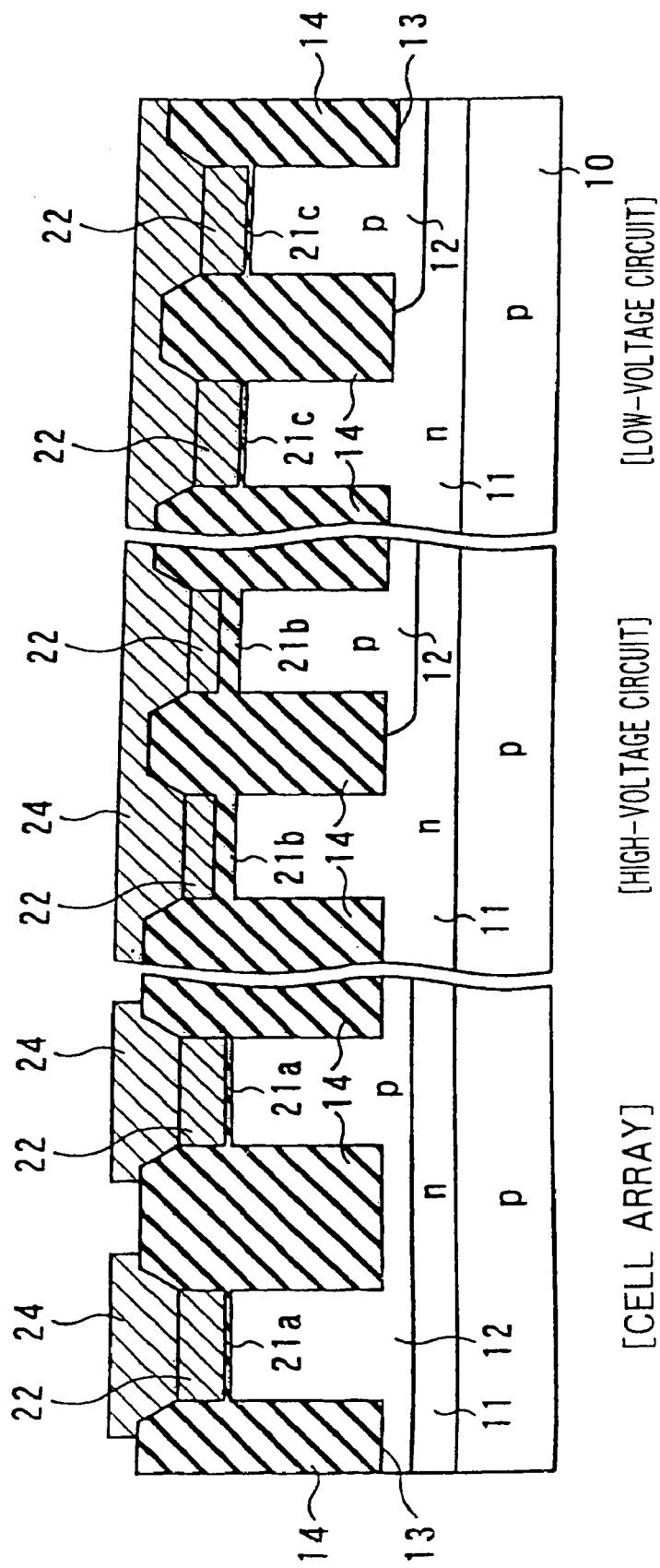
FIG. 9 is a cross-sectional view that shows a step of isolation of floating gates in the cell array region in the first embodiment.

After that, through a lithographic step, the second-layer polycrystalline silicon film 24 in the cell array region is selectively etched to separate it on the device isolation regions as shown in FIG. 9. In the cell array region, the multi-layered film of the first-layer polycrystalline silicon film 22 and the second-layer polycrystalline silicon film 24 will form floating gates. At this stage, however, in the direction normal to the drawing sheet, isolation of floating gates into individual memory cells is not conducted.

Figure 10:
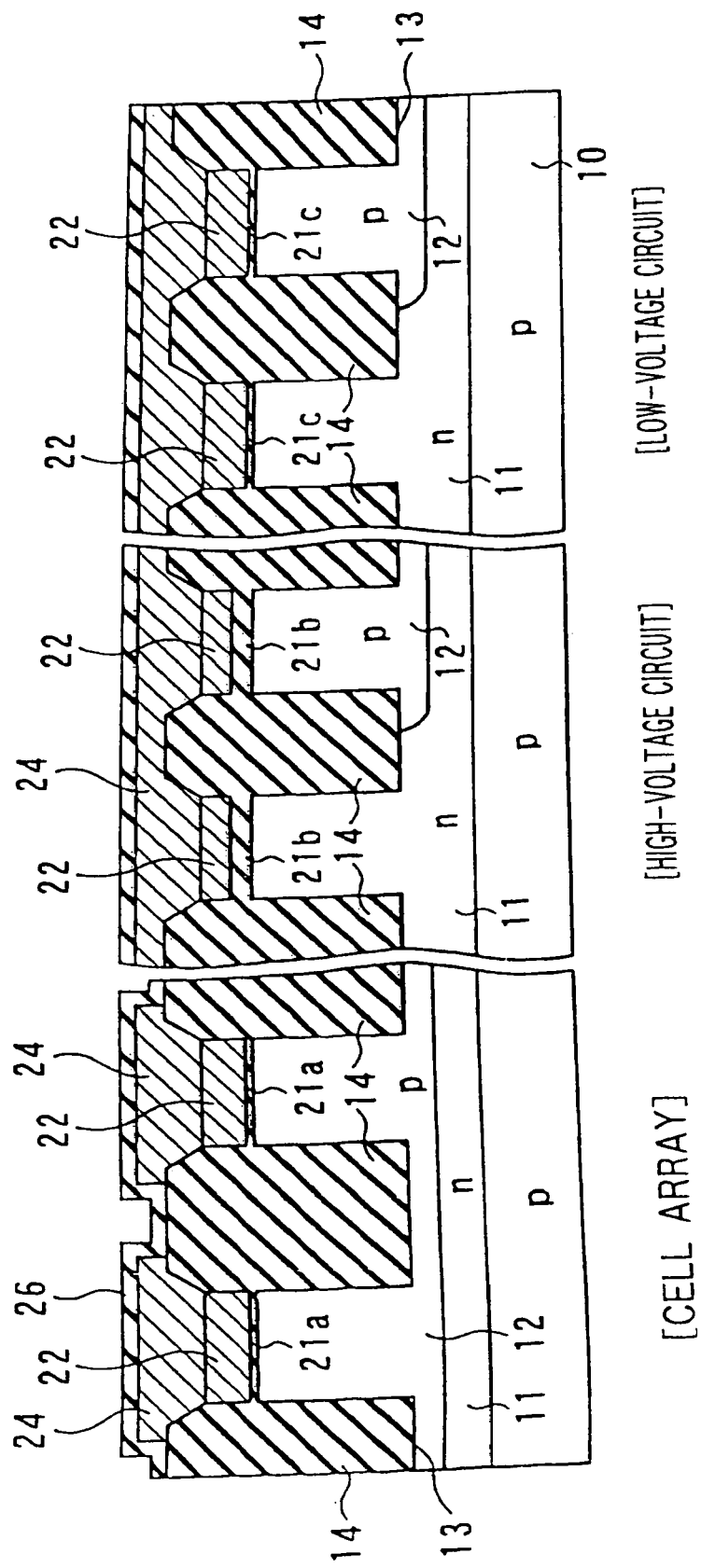
FIG. 10 is a cross-sectional view that shows a step of making a gate insulating film in the first embodiment.
Figure 11:
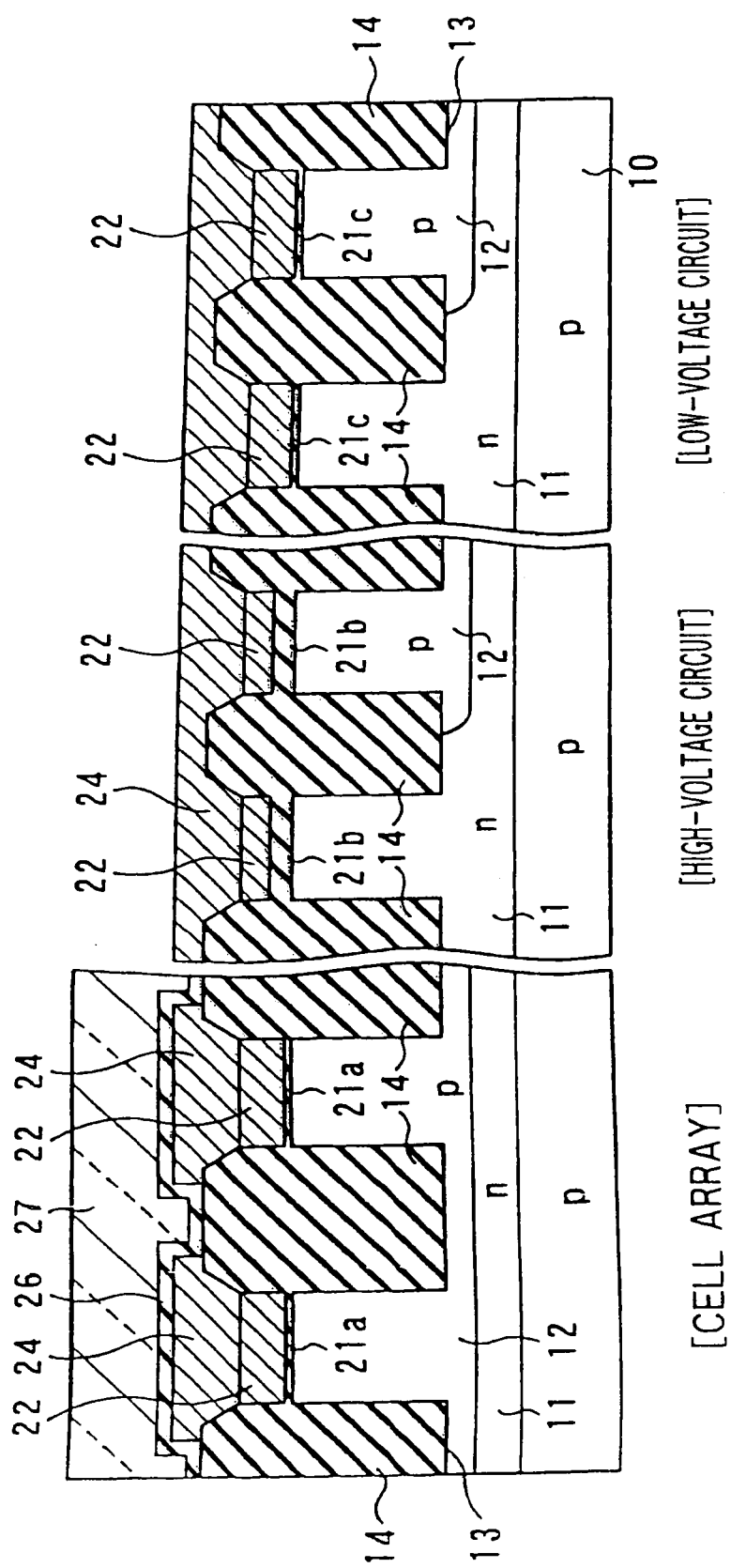
FIG. 11 is a cross-sectional view that shows a step of removing the gate insulating film in the peripheral circuit region in the first embodiment.

After that, as shown in FIG. 10, a gate insulating film 26 is formed on the entire surface of the substrate for the purpose of separating floating gates and control gates to be formed thereon into discrete memory cells. The gate insulating film 26 is an ONO film. Then, as shown in FIG. 11, a resist 27 covering the cell array region is formed by patterning to remove the gate insulating film 26 from the peripheral circuit region by etching.

Figure 12:
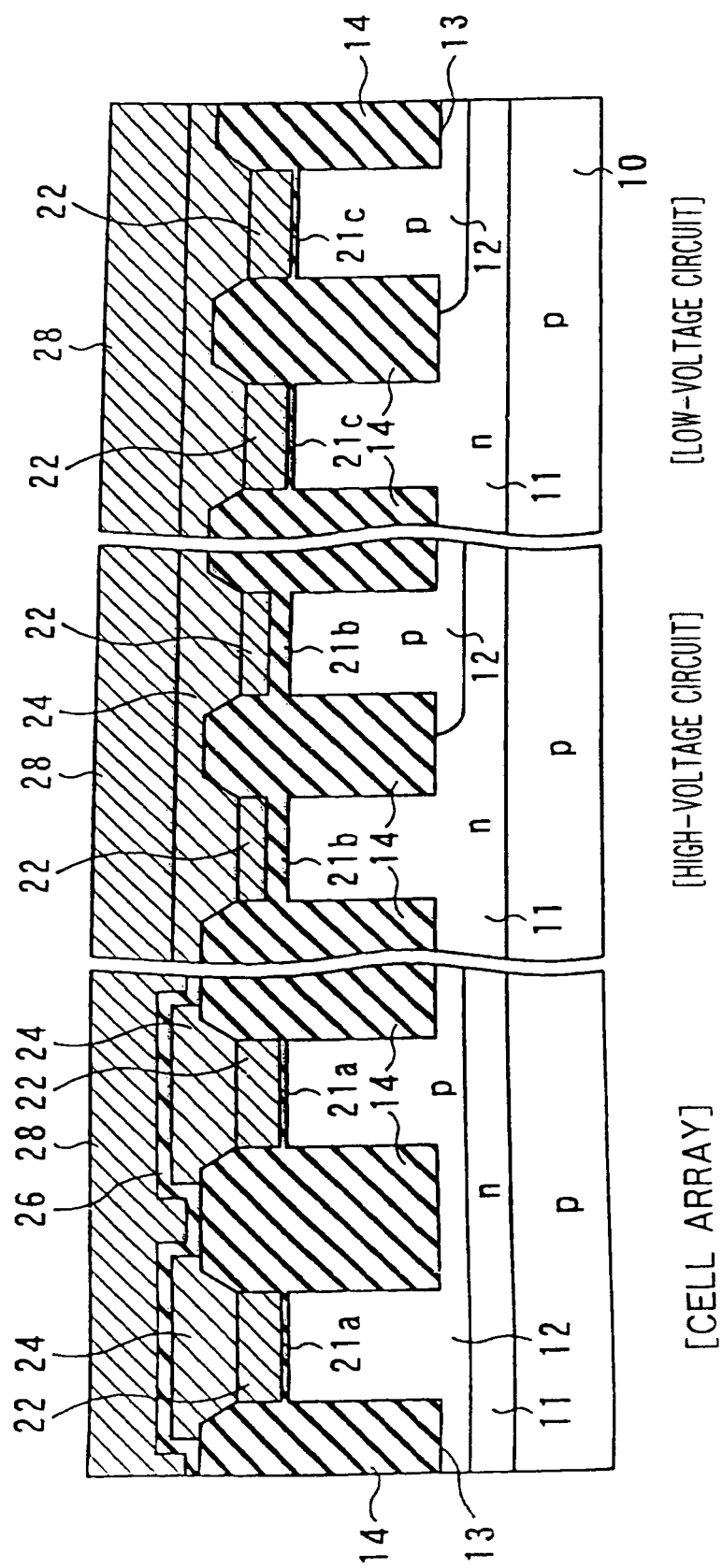
FIG. 12 is a cross-sectional view that shows a step of stacking a third-layer polycrystalline silicon film in the first embodiment.

After that, as shown in FIG. 12, a third-layer polycrystalline silicon film 28 is stacked on the entire surface. This third-layer polycrystalline silicon film 28 is also a non-doped film, which will form the control gates in the cell array region and the top layers of the gate electrodes in the peripheral region. In the peripheral circuit region, three layers of the non-doped polycrystalline silicon film 22, 24, 28 result in having been stacked in contact with each other.

Figure 13:
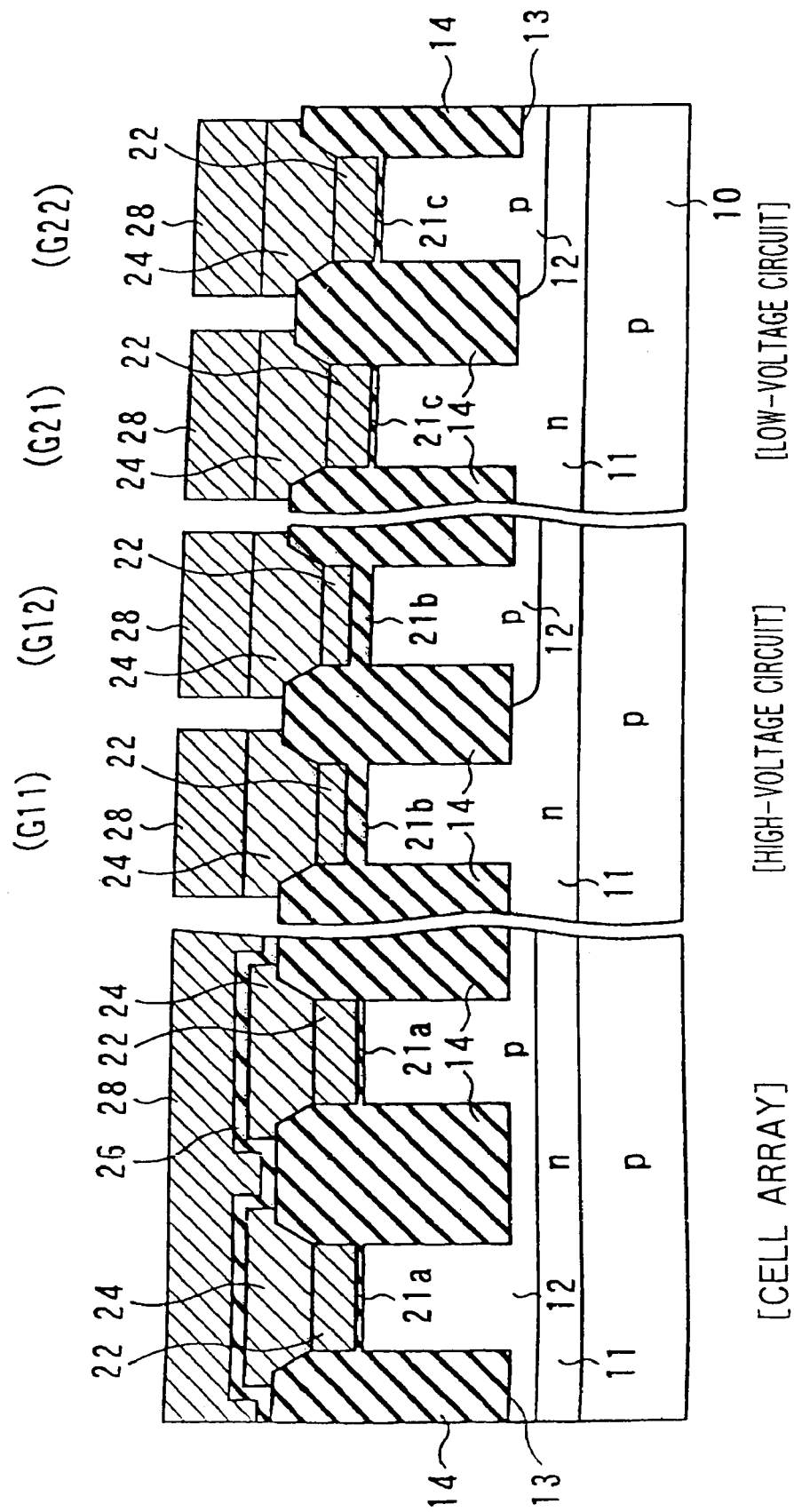
FIG. 13 is a cross-sectional view that shows a step of patterning gate electrodes in the first embodiment.

Subsequently, gate electrode processing in each region is conducted. As shown in FIG. 13, in the cell array region, the third-polycrystalline silicon film 28 is patterned to form lines of control gates that are continuous as word lines, and in self alignment with them, the second-layer polycrystalline silicon film 24 and the first-layer polycrystalline silicon film 22 are patterned and separated into floating gates of individual memory cells in the direction normal to the drawing sheet. In the peripheral circuit region, the third-layer polycrystalline silicon films 22, 24, 28 are patterned into gate electrodes and gate wirings. FIG. 13 shows that gate electrodes G11 of PMOS transistors and gate electrodes G12 of NMOS transistors have been formed by patterning in the high-voltage circuit whereas gate electrodes G21 of PMOS transistors and gate electrodes G22 of NMOS transistors have been formed by patterning in the low-voltage circuit.

Figure 14:
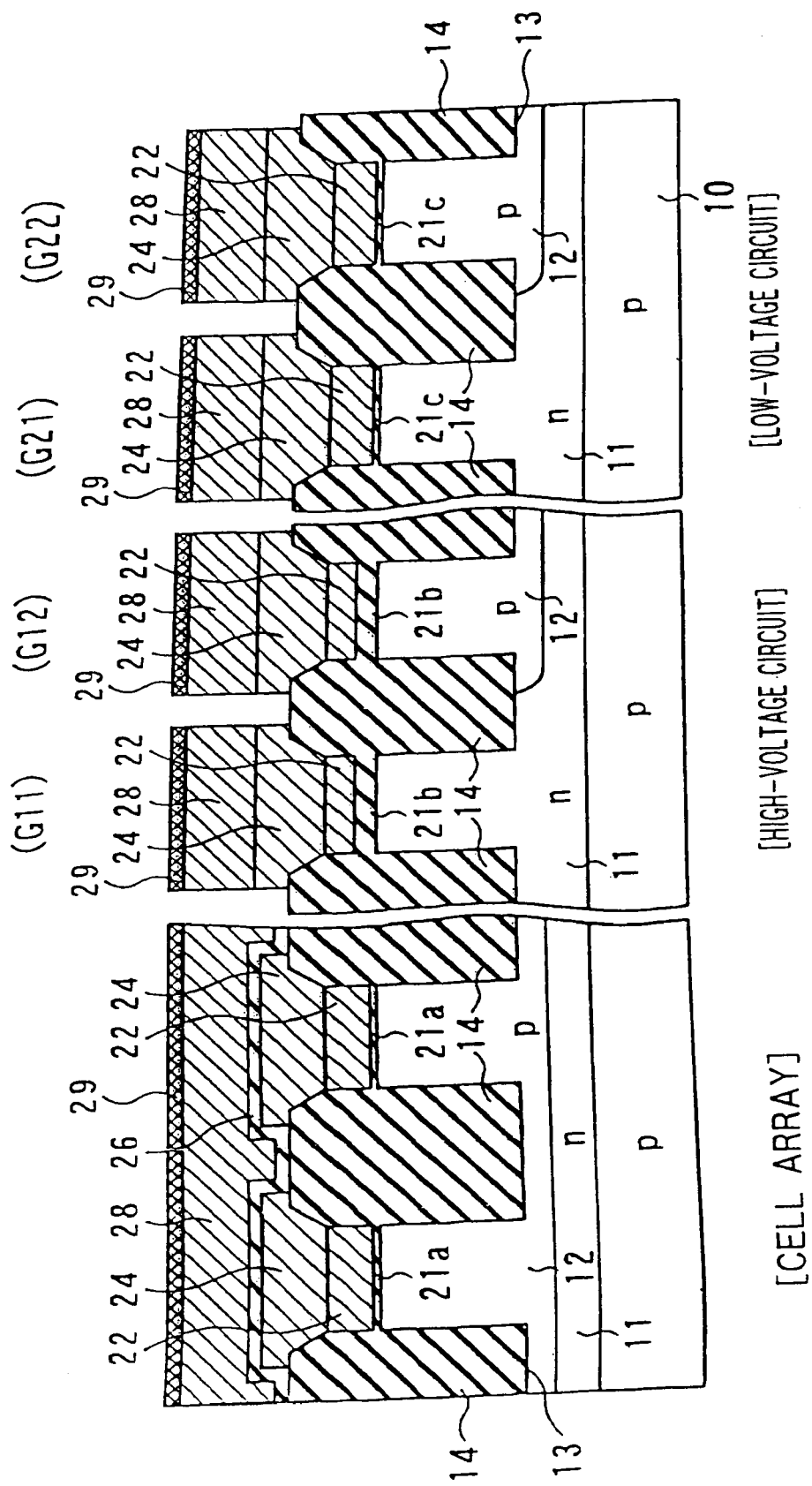
FIG. 14 is a cross-sectional view that shows a salicide step in the first embodiment.

After that, ions are introduced into the respective circuit regions under different conditions to obtain desired conduction types and optimum impurity concentrations for respective gate electrodes to for source and drain diffusion layers. Conditions therefor will be described later. After that, as shown in FIG. 14, a salicide film 29 of a metal having a high melting point, such as Co, for the purpose of lowering the resistance, is formed on surfaces of the diffusion layers and the gate electrodes.

A modification of the foregoing embodiment will be explained below. In the foregoing embodiment, as shown in FIG. 11, after the gate insulating film 26 is stacked and removed from the peripheral circuit region, the third layer-polycrystalline Si film 28 is stacked to serve as control gates in the cell array region. Further, in the peripheral circuit, the first-layer polycrystalline Si film 22, second-layer polycrystalline 24 and third-layer polycrystalline Si film 28 are in direct contact to function as gate electrodes in the peripheral circuit region. It is further decrease here that, even when a photoresist is coated on the gate insulating film 26, reliability of the insulating film is not degraded. It is also desirable to decrease the height of the gate electrodes of the peripheral transistors. For these purposes, here is proposed the modification shown below.

Figure 14A:
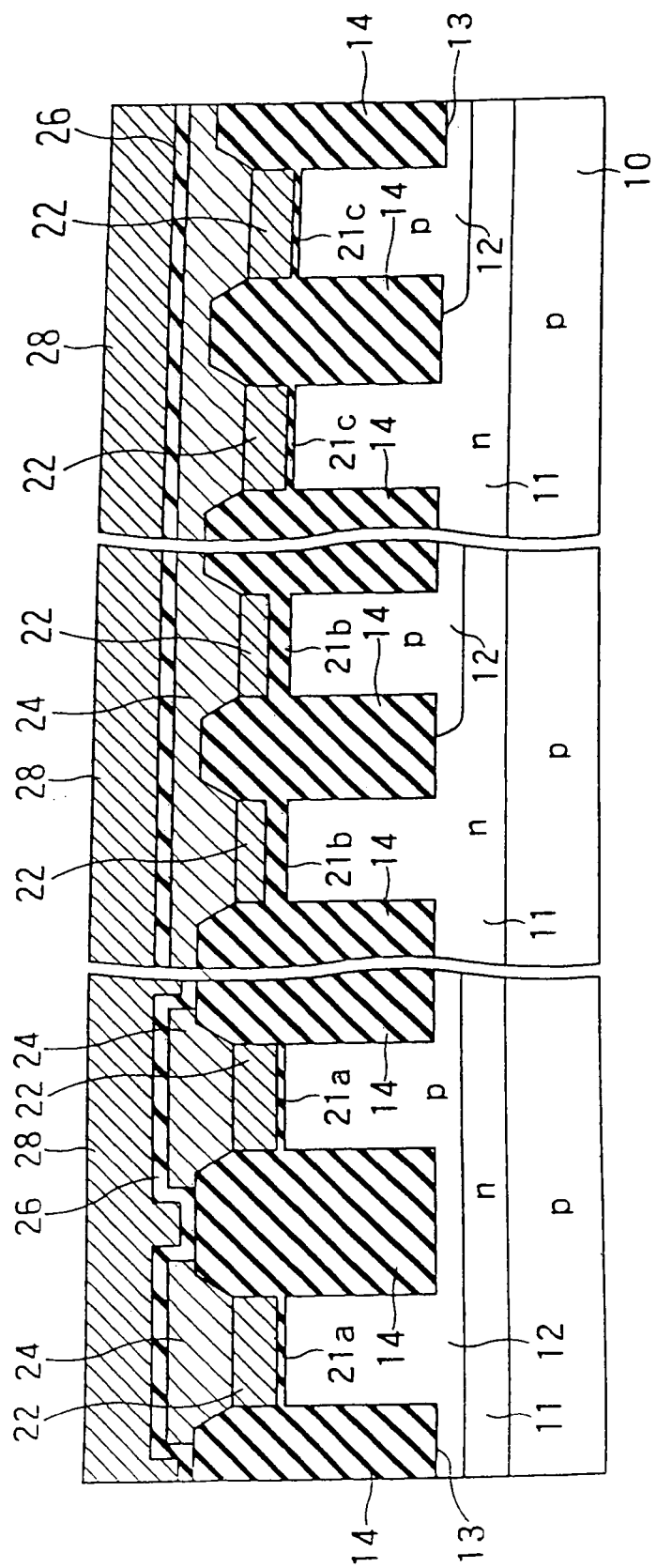
FIGS. 14A through 14D are cross-sectional views of a modification that is partly modified from the first embodiment.
Figure 14B:
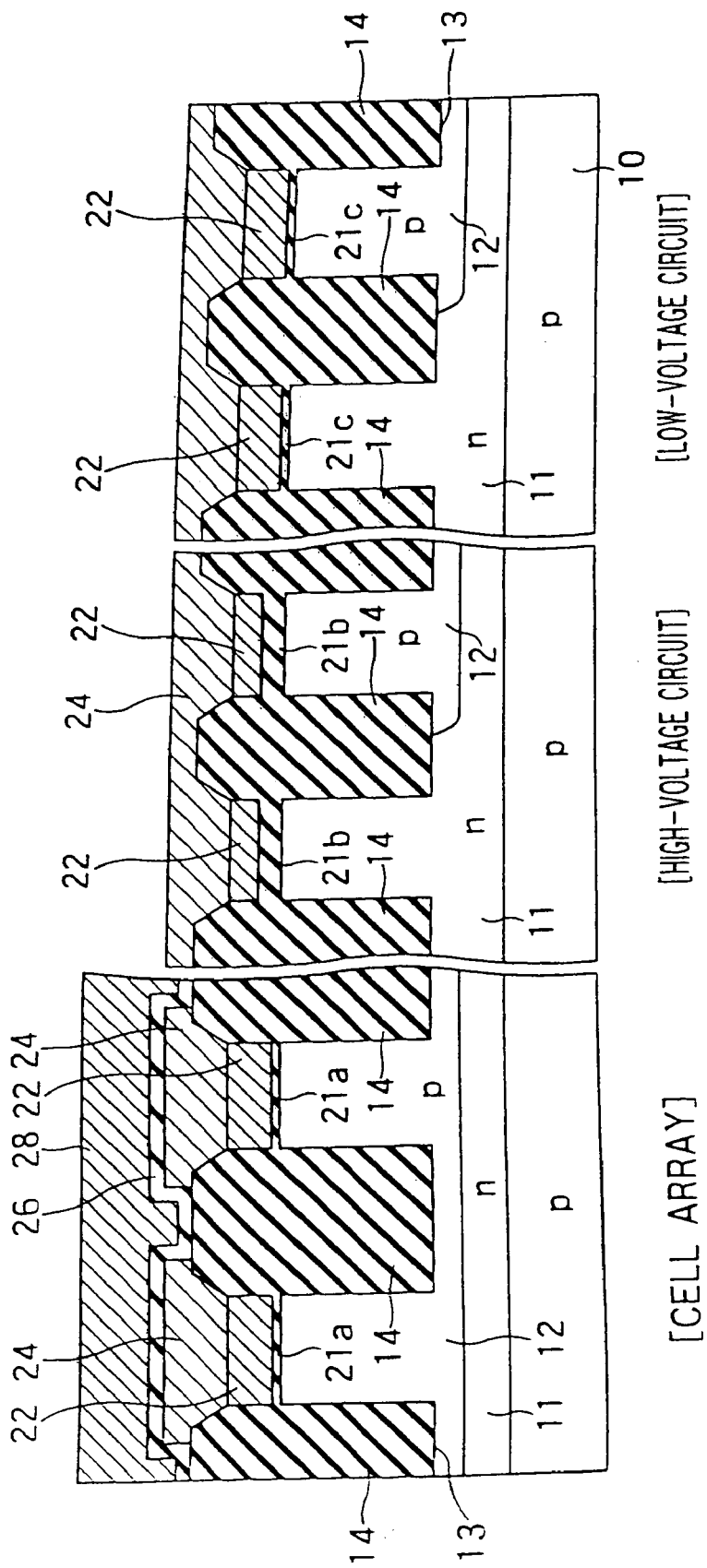
Figure 14C:
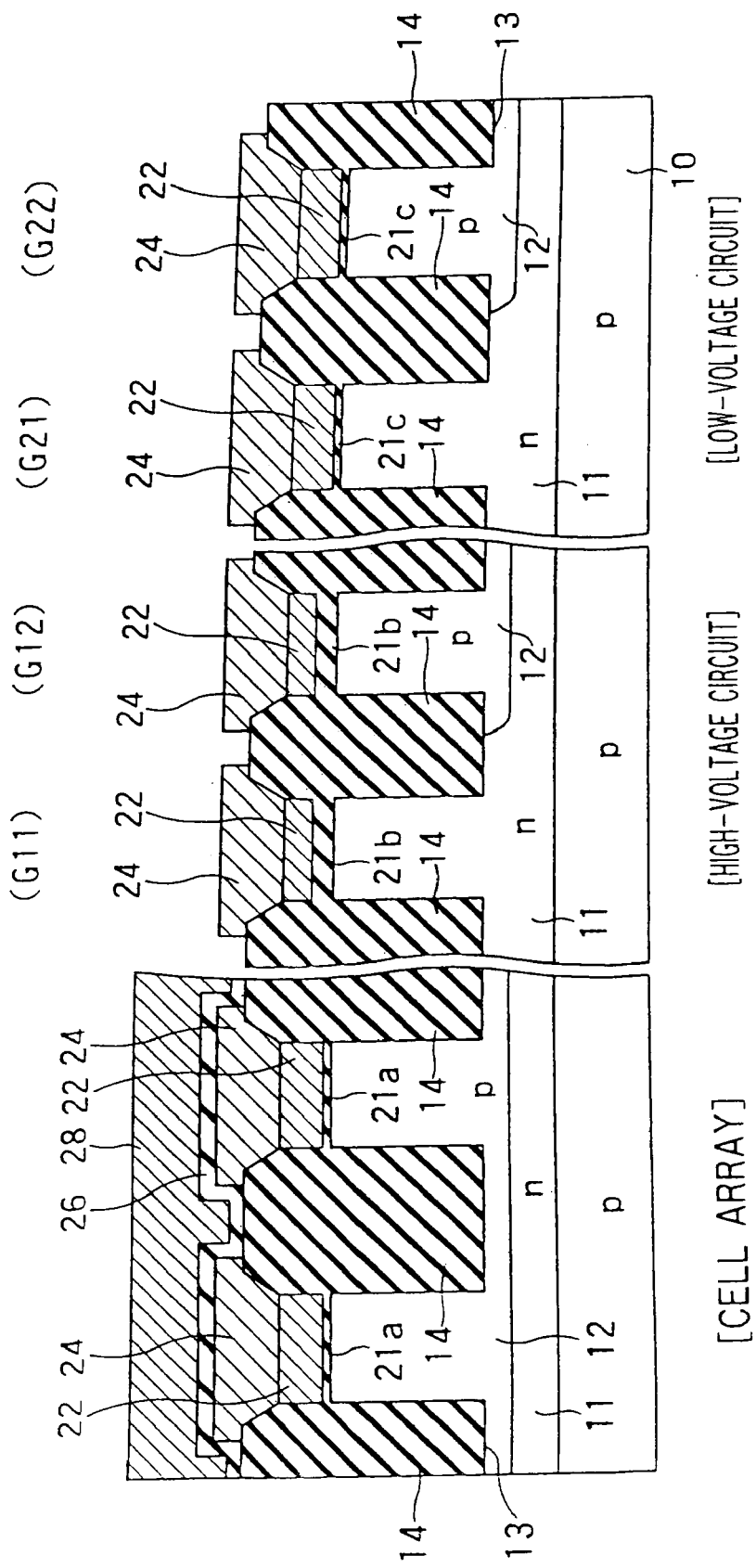
Figure 14D:
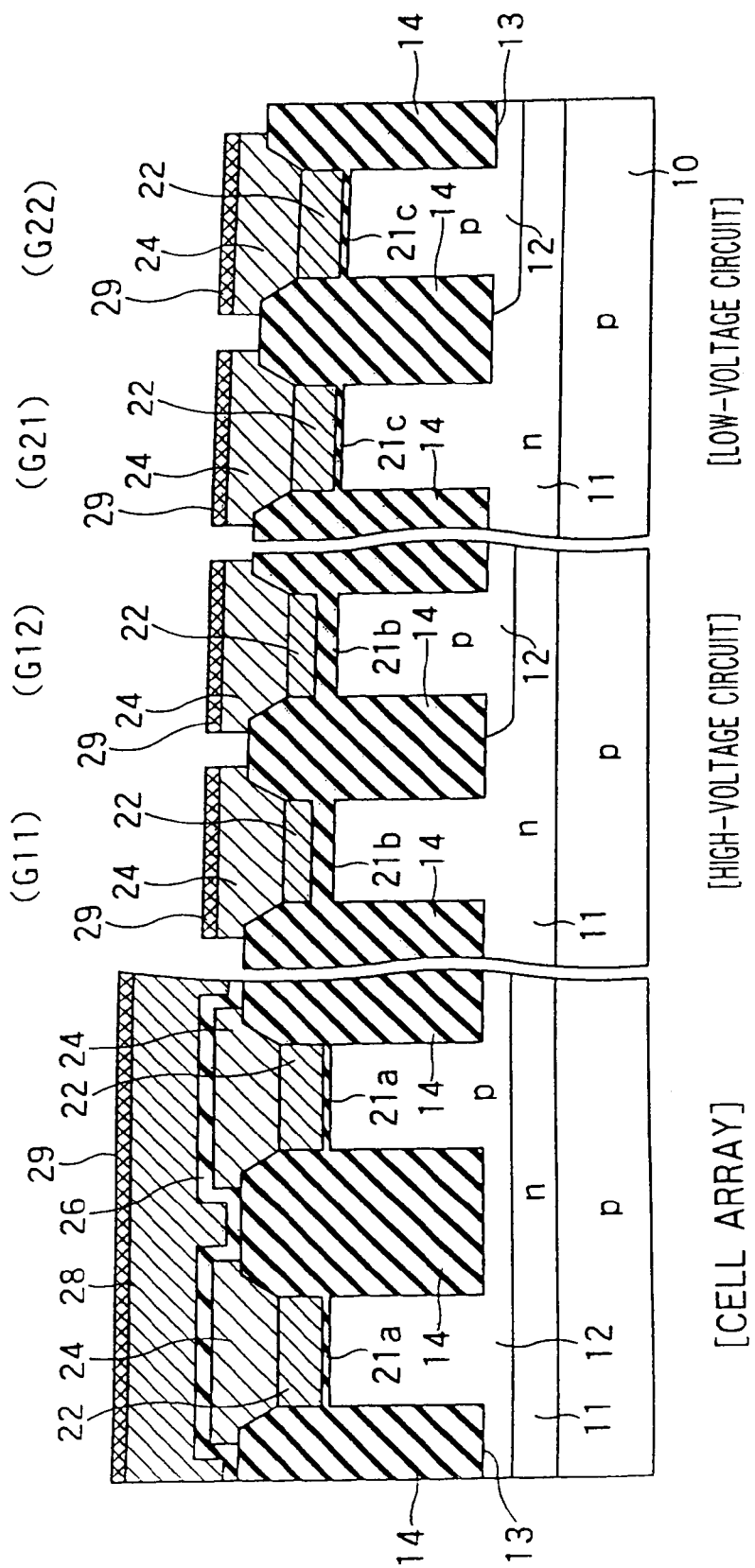

This modification is the same as the foregoing embodiment up to the step of FIG. 10. After the step of FIG. 10, however, the polycrystalline silicon film 28 is stacked on the entire surface as shown in FIG. 14A. Next as shown in FIG. 14B, the third-layer polycrystalline silicon film 28 and the underlying gate insulating film 26 are removed by etching from the peripheral region, which are central and right areas in the drawing. After that, as shown in FIG. 14C, two layers of the polycrystalline silicon films 22, 24 are patterned into the form of respective gate electrodes and gate wirings. G11, G12, G21 and G22 in FIG. 14C correspond to those in FIG. 13. Subsequent processing of ion implantation to obtain desired conduction types and optimum impurity concentrations of respective gate electrodes and making source and drain diffusion layers is the same as shown in FIG. 14. Then, as shown in FIG. 14D, the salicide film 29 of a metal having a high melting point, such as Co, for the purpose of lowering the resistance, is formed on surfaces of the diffusion layers and the gate electrodes.

With the structure explained above, since the top surface of the gate insulating film is protected by the third-polycrystalline Si film, its reliability does not deteriorate. Further, in the peripheral circuit region, the polycrystalline Si film of the gate electrodes results in comprising the continuous two layers, i.e. the first-layer polycrystalline Si film 22 and the second-layer polycrystalline Si film 24. Therefore, height of the gates is lower, and they are more easily processed than those of the foregoing embodiment. Transistors with such a two-layered structure are shown in FIG. 15A, which correspond to FIG. 15.

An example of cross-sectional structures of transistors of a memory cell and the peripheral circuit region are explained below with reference to FIG. 15. The structure is characterized in the configuration of the gate electrodes.

In both the peripheral circuit region and the cell array region, there are provided source and drain extension regions with relatively low impurity concentrations, and source and drain regions with high impurity concentrations (LDD structure). Before making side walls 36, impurities are introduced into the extension regions (N−, P−), and after making the side walls 36, impurities are introduced into the regions with high impurity concentrations (N+, P+). Normally, the gate electrodes are simultaneously doped upon ion implantation into regions with a high impurity concentration. Amount of this ion implantation may be around $3 \times 10^{15}$ cm-2. Amount of implantation in the extension regions is typically not higher than $1 \times 10^{15}$ cm-2. In general, materials of impurities and their concentrations are different among N-type extensions and high-concentrated diffusion layers in memory cells and the peripheral circuit region.

Figure 15:
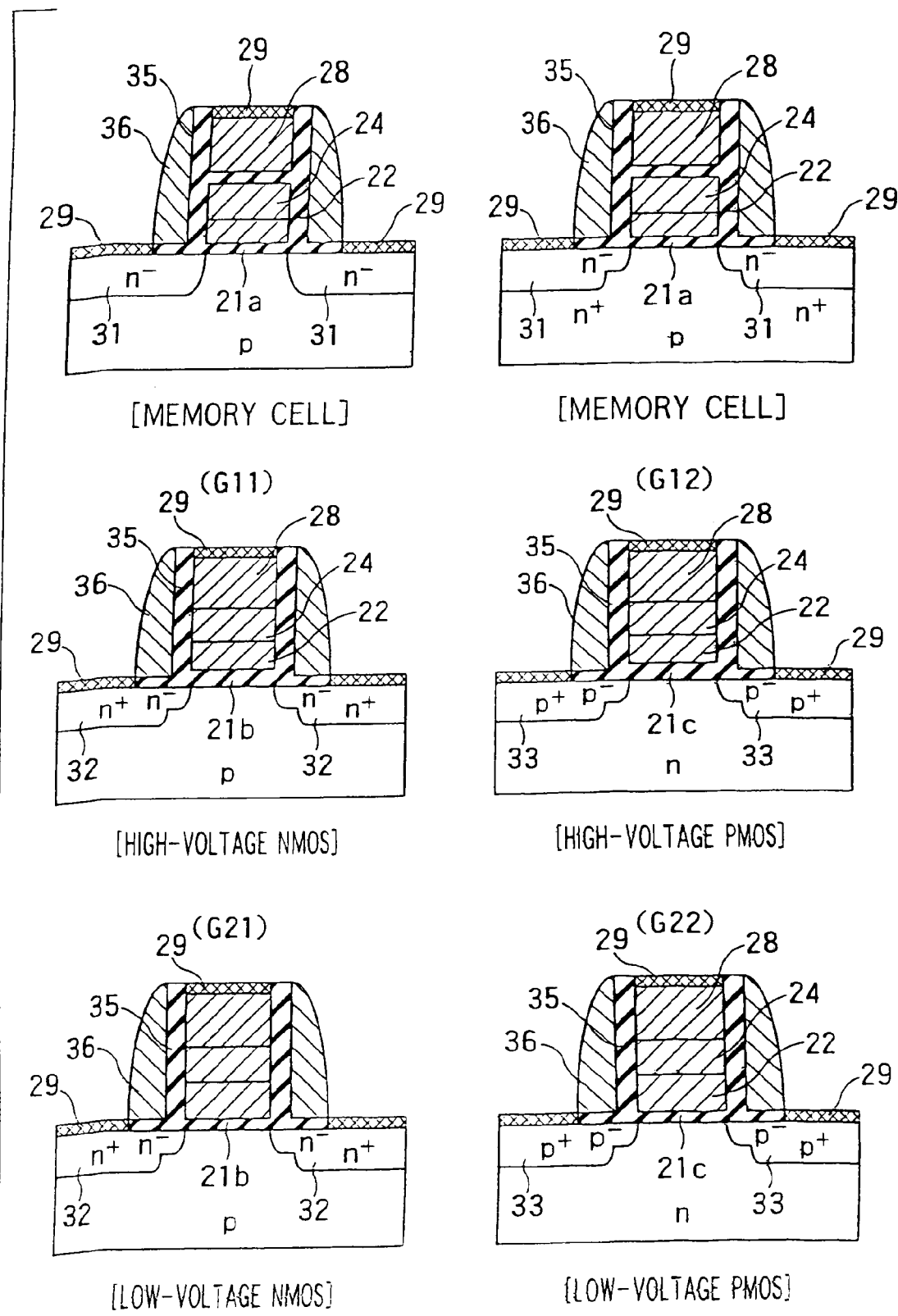
FIG. 15 provides cross-sectional views that show device structures of different circuit regions in the first embodiment.
Figure 15A:
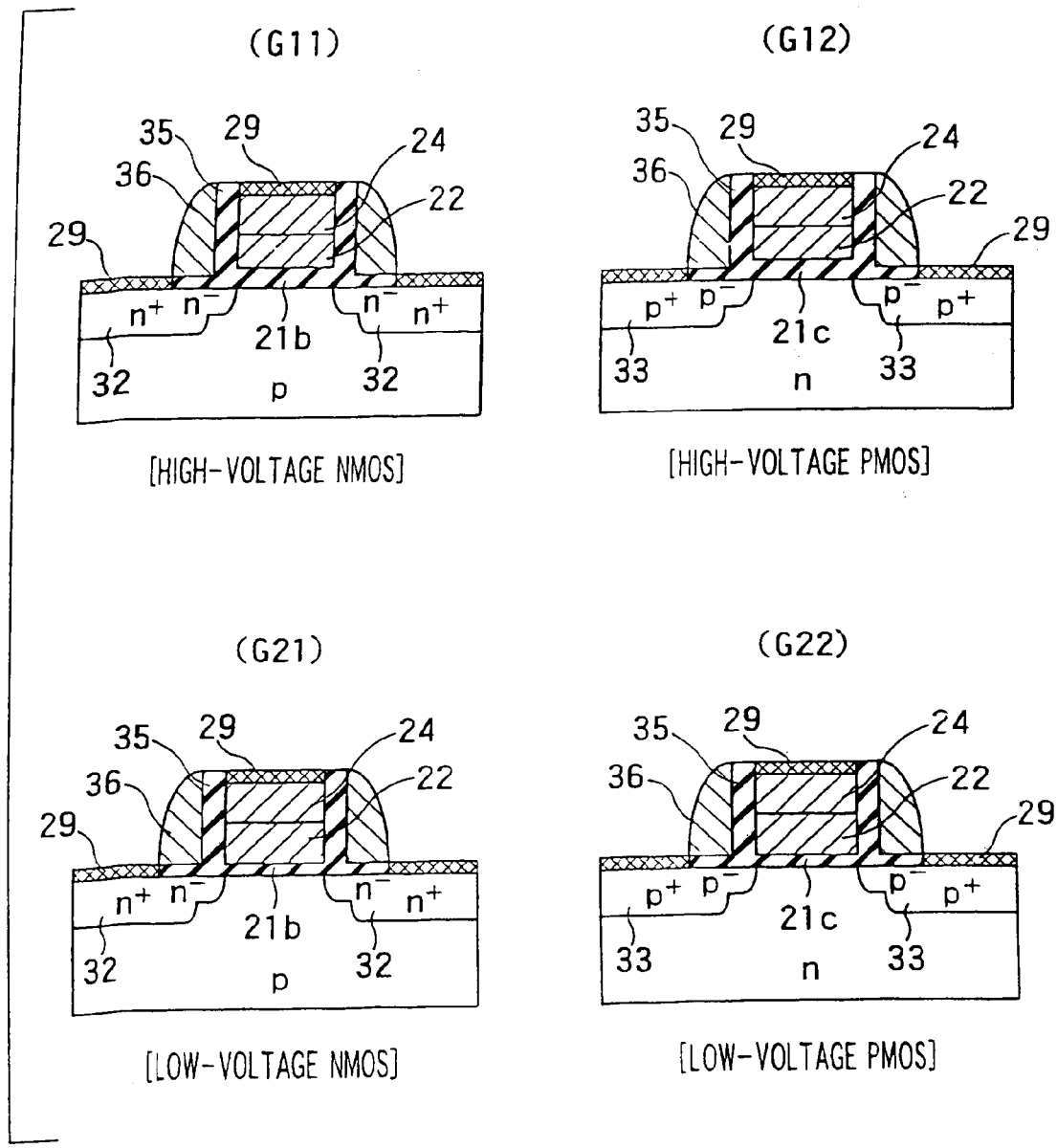
FIG. 15A provides cross-sectional views that show device structures of different circuit regions in an example having a two-layered structure.

In general, as shown in FIG. 15, individual gate electrodes are covered with an oxide film 35 by post-oxidation to make a side wall insulating film 36 of a silicon nitride. Then, surfaces of the gate electrodes and diffusion layers are exposed, a metal with a high melting point is stacked, and thereafter, the salicide layer 29 is formed on the gate electrodes and the diffusion layers by annealing to obtain a salicide structure.

Memory cells and peripheral transistors are not limited to those structures; depending upon the types of and required performance of the memory cells. Memory cells, for example, may have only N− regions in NAND flash memory as shown in FIG. 15. In this case, the process may be modified to prevent that a high-concentrated diffusion layer or silicide layer is formed in portions of the N− layer.

The third gate electrode, stacked, may be doped with an N-type impurity.

Through those steps, the process of making devices is completed. Subsequently, although not shown, an inter-layer insulating film is stacked, contact holes are made, and metal wirings including bit lines and source lines are made.

According to the embodiment explained above, in which device isolation by STI technique is executed after the tunnel insulating film in the cell array region and the gate insulating film of high-voltage transistors and low-voltage transistors in the peripheral circuit are made under their optimum conditions, it is possible to prevent retraction of the buried insulating film in the peripheral circuit region and deterioration of the transistor characteristics in the peripheral circuit, which are problems involved in the conventional technique configured to repeat etching of oxide films after isolation of devices.

Further, since the floating gates in the cell array region have a two-layered polycrystalline silicon structure whereas the gate electrodes of peripheral circuit transistors have a three-layered polycrystalline silicon structure, both formed under individually optimum conditions for introducing impurities (conduction types and concentrations), more stable write and erase characteristics in the cell array, higher performance of the peripheral circuit, and higher reliability of the, flash memory are ensured.

Especially in case of the instant embodiment, in which phosphorus is used as the impurity of the floating gates in the cell array, since corners of the floating gates are rounded thereby in a later oxidation step, concentration of electric fields is prevented during write and erase operations using highly raised potentials. Therefore, fluctuation among individual cells is prevented, and excellent write and erase characteristics required for chips, such as enabling a tight write and erase profile, can be obtained. As to NMOS transistors in the peripheral circuit, arsenic is doped into the source, drain diffusion layers and the gate electrodes, and high-performance transistors with shallow diffusion layers can be obtained.

Second Embodiment

A manufacturing process of another embodiment of the invention will be explained below with reference to FIGS. 16 through 22. The steps shown in FIGS. 1 through 6 are common to the instant embodiment. That is, also in this embodiment, optimum gate insulating films are formed respectively in the cell array region, high-voltage circuit region and low-voltage circuit region of the peripheral circuit, the non-doped first-layer polycrystalline silicon film 22 is formed thereon, and the device isolation insulating film 14 is buried.

Figure 16:
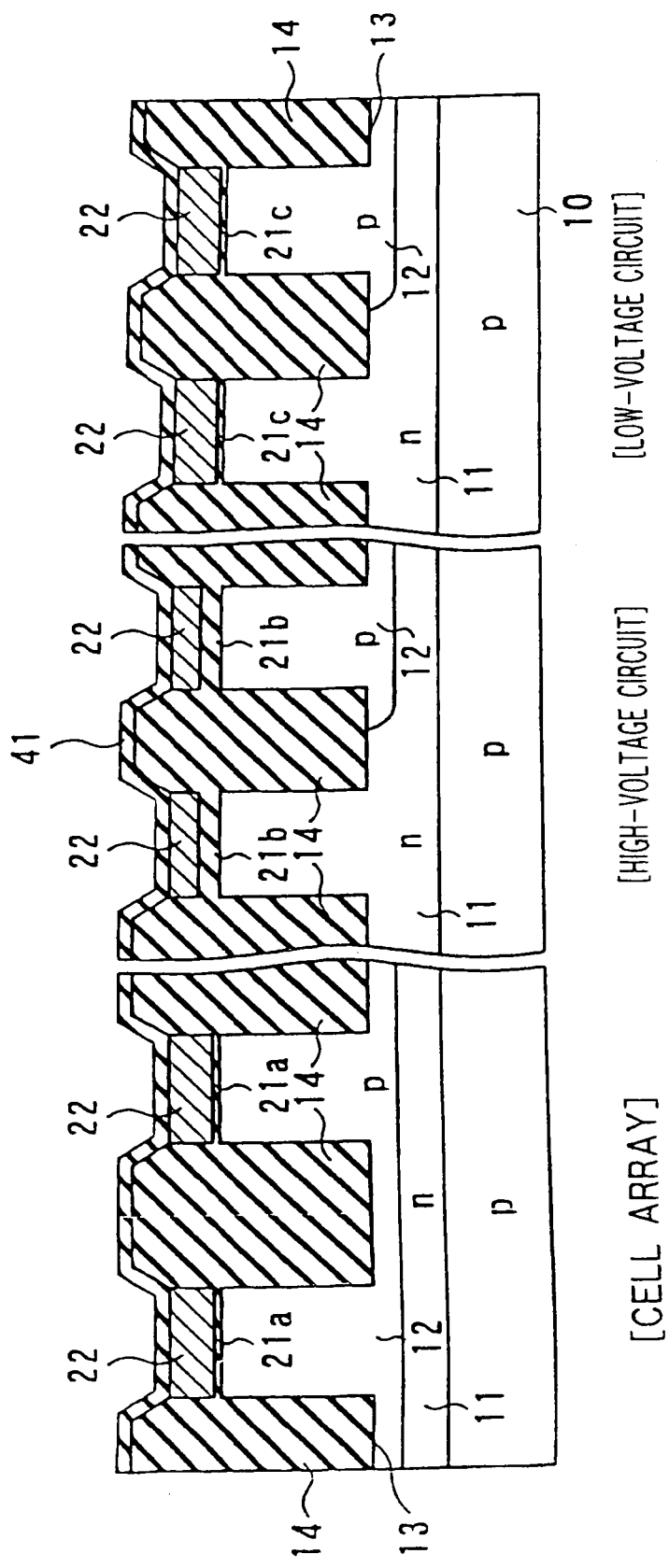
FIG. 16 is a cross-sectional view that shows a step of forming a block film in the second embodiment.
Figure 17:
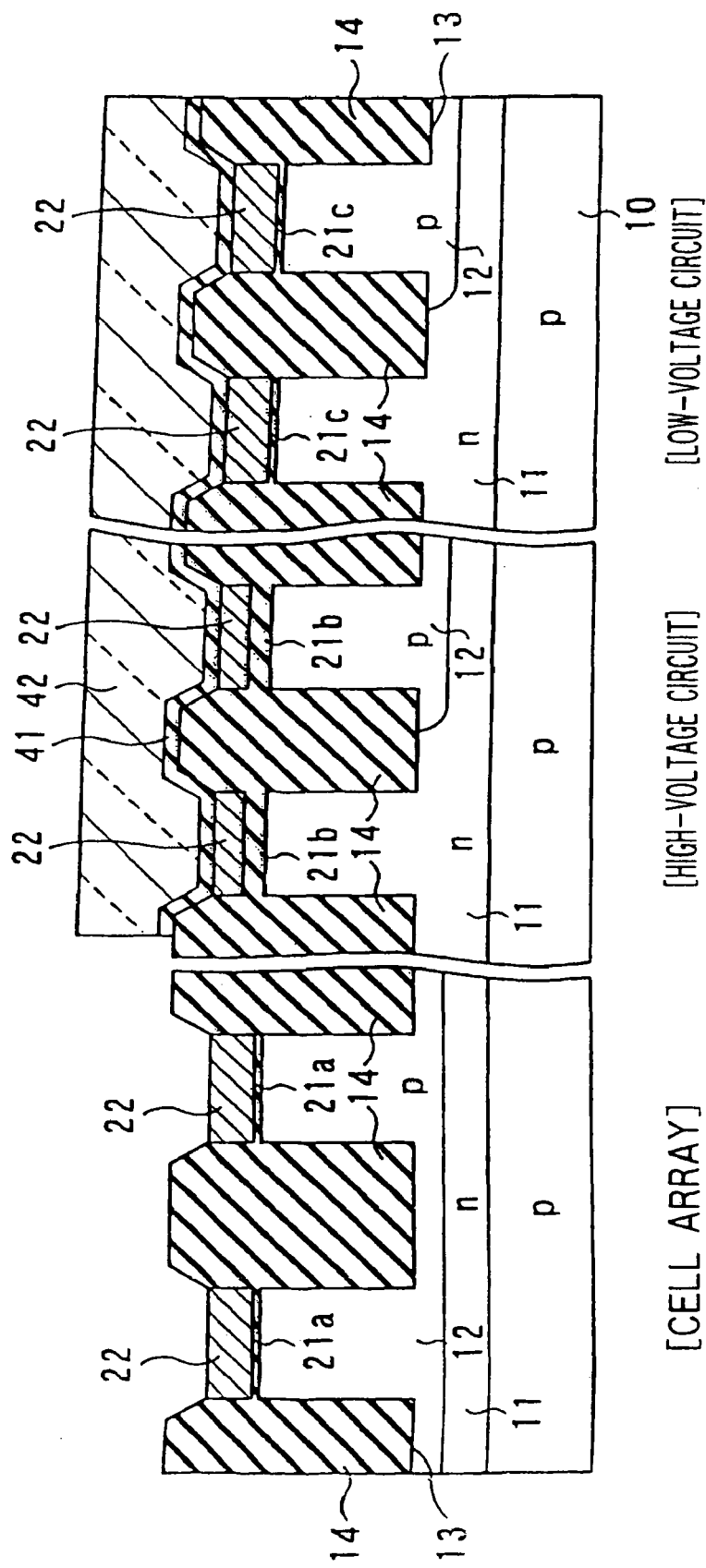
FIG. 17 is a cross-sectional view that shows a step of selectively etching the block film in the second embodiment.

After the step of FIG. 6, the instant embodiment takes the step of FIG. 16 in which a barrier film (block film) 41 is formed on the entire surface to function as both a barrier against impurity diffusion and an etching stopper used as this barrier film 41 is, for example, a silicon oxide film by CVD, but a silicon nitride film is also usable. After that, as shown in FIG. 17, a resist 42 having an aperture in the cell array region is formed by patterning, and the barrier film 41 is selectively removed from the cell array region by etching using the resist 42 as a mask.

Figure 18:
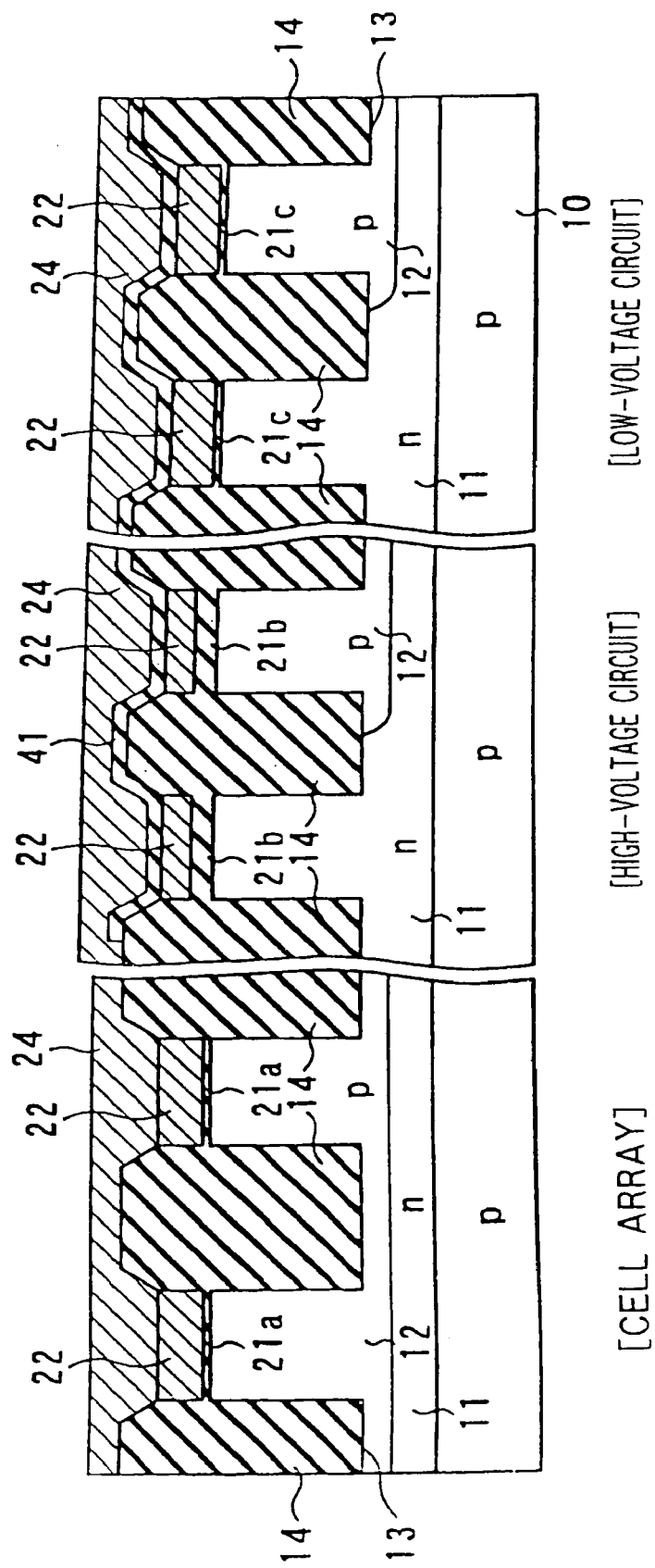
FIG. 18 is a cross-sectional view that shows a step of stacking a second-layer polycrystalline silicon film in the second embodiment.

After that, as shown in FIG. 18, the second-layer polycrystalline silicon film 24 is stacked on the entire surface. Let this second-layer polycrystalline silicon film 24 be polycrystalline silicon doped with phosphorus during deposition unlike that of the first embodiment. Thus the second-layer polycrystalline silicon film 24 is in direct contact with the first-layer polycrystalline silicon film 22 merely in the cell array region. In a later thermal step, phosphorus diffused from the second-layer polycrystalline silicon film 24 into the first-layer polycrystalline silicon film 22, and the resulting composite film will form floating gates in the cell array region. In the peripheral circuit region, diffusion of phosphorus from the second-layer polycrystalline silicon film 24 into the first-layer polycrystalline silicon film 22 is blocked by the barrier film 41.

Figure 19:
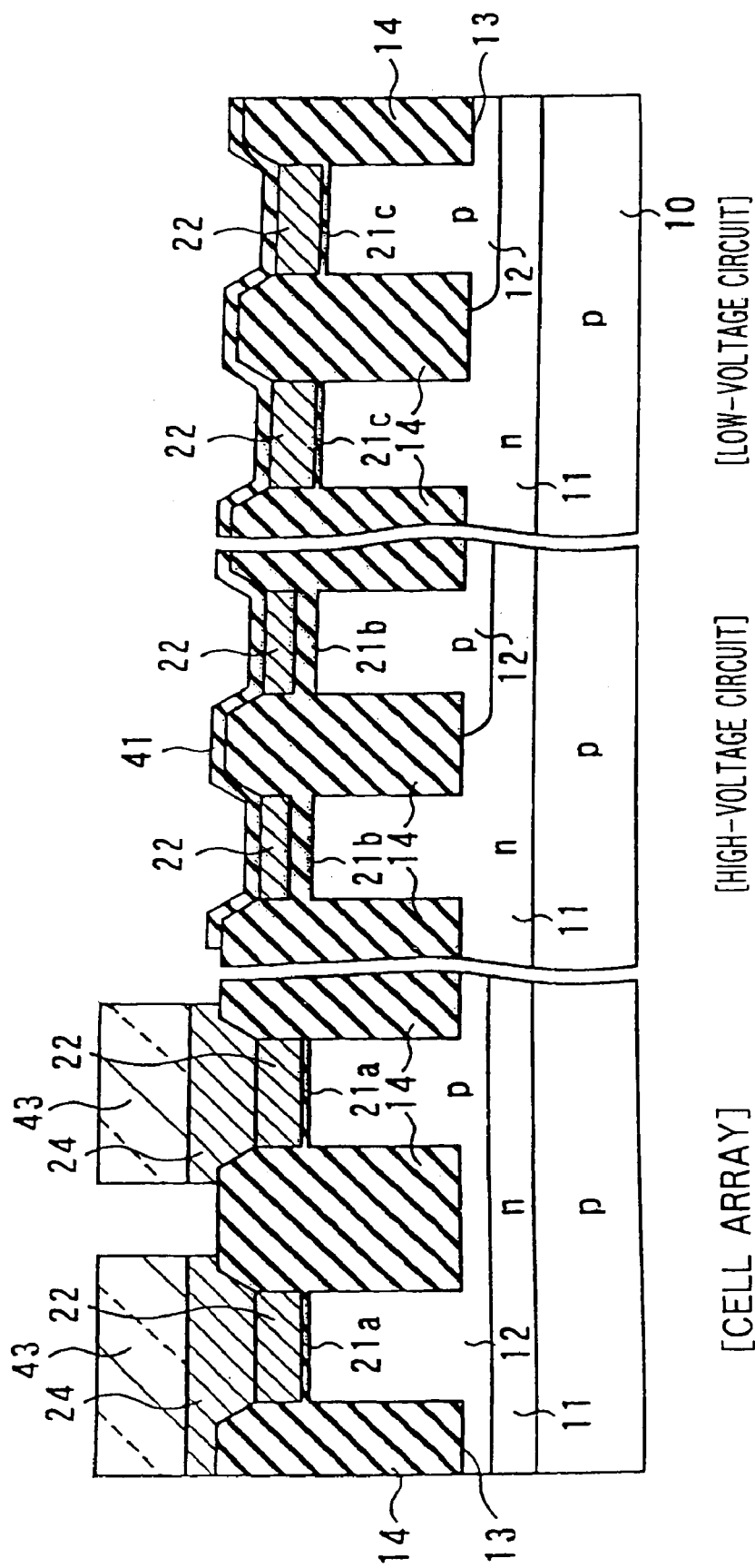
FIG. 19 is a cross-sectional view that shows a step of selective etching the second-layer polycrystalline film in the second embodiment.

After that, as shown in FIG. 19, a resist pattern 43 having openings in the device isolation regions in the cell array region and having an opening all over the peripheral circuit region is formed by patterning, and the second-layer polycrystalline silicon film 24 is selectively etched. As a result, the first-layer polycrystalline silicon film 22 and floating gates made up of the second-layer polycrystalline silicon layer 24 are separated on the device isolation regions in the cell array region whereas the second-layer polycrystalline silicon film 24 is removed in the peripheral circuit region.

Figure 20:
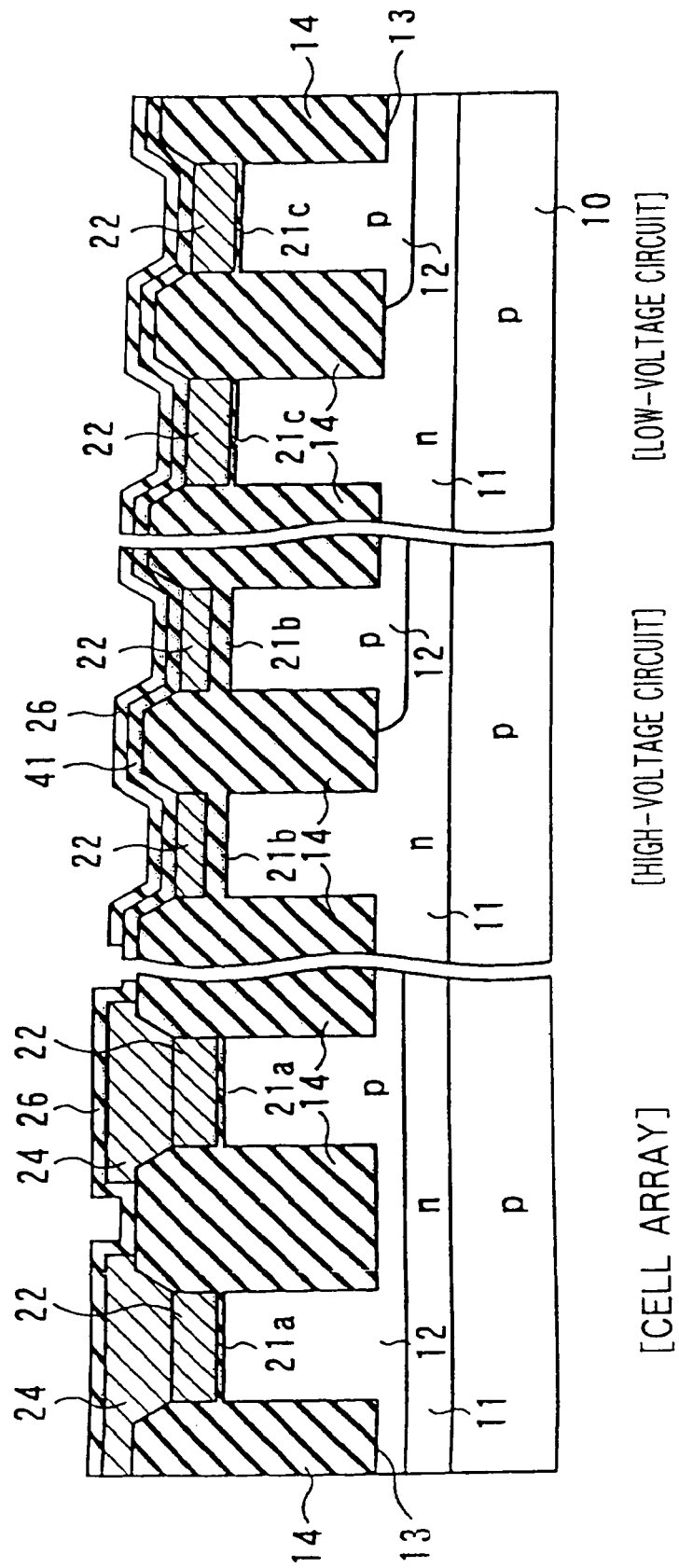
FIG. 20 is a cross-sectional view that shows a step of making a gate insulating film in the second embodiment.
Figure 21:
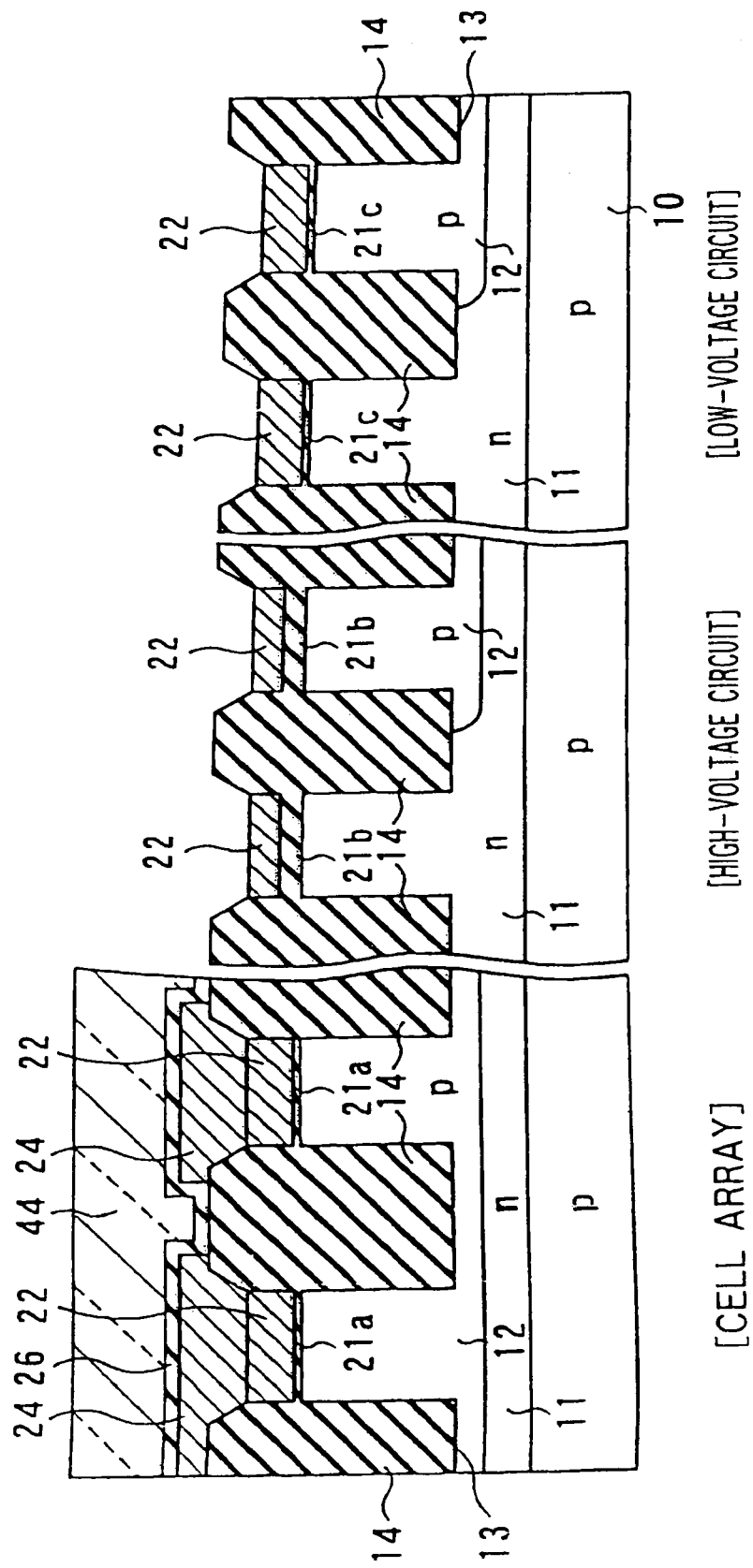
FIG. 21 is a cross-sectional view that shows a step of etching the gate insulation film and the block film in the second embodiment.

After that, as shown in FIG. 20, the gate insulating film 26 is formed for separating floating gates and control gates in the cell array region. Like the foregoing embodiment, let the gate insulating film 26 be an ONO film. Then as shown in FIG. 21, a resist 44 is formed in a pattern covering the cell array region, and the gate insulating film 26 is removed by etching together with the underlying barrier film 41 from the peripheral circuit region by etching.

Figure 22:
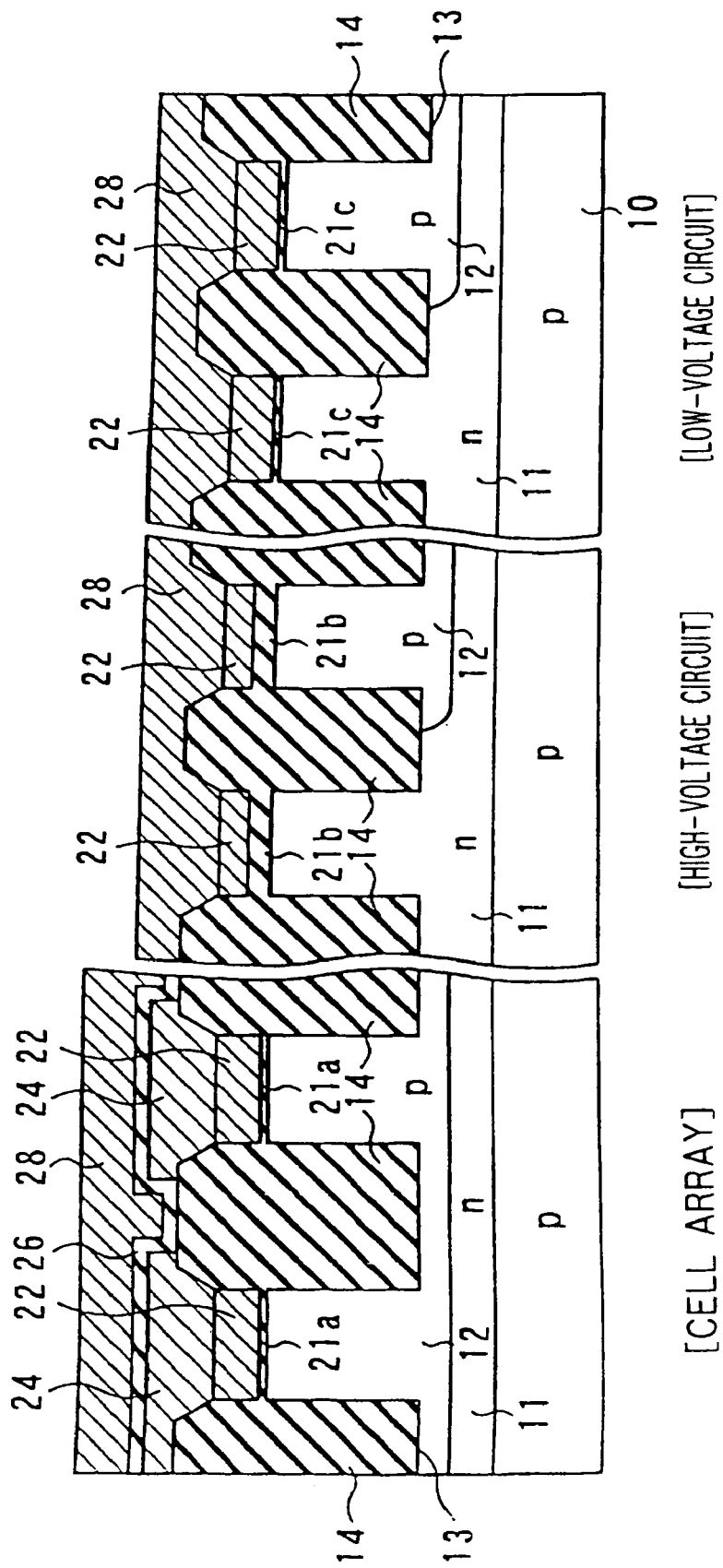
FIG. 22 is a cross-sectional view that shows a step of stacking a third-layer polycrystalline silicon film in the second embodiment.

Subsequently, as shown in FIG. 22, the third-layer polycrystalline silicon film 28 is stacked the third-layer polycrystalline silicon film 28 is a non-doped film similarly to the foregoing embodiment. Subsequently, through the same steps as those of FIG. 13, et seq. already explained with reference to the first embodiment, gate electrodes are formed by patterning in respective circuit regions, ion implantation is conducted under different conditions for respective circuit regions, optimum conduction types and optimum impurity concentrations are adjusted for gate electrodes, and source and drain diffusion layers are formed. Conditions for these steps are the same as those of the first embodiment. After that, a salicide film of a metal having a high melting point, such as Co, is preferably formed on surfaces of the diffusion layers and gate electrodes for the purpose of lowering the resistance.

The instant embodiment is also configured to execute device isolation by STI technique after making the tunnel insulation film in the cell array region and gate insulation film of high-voltage transistors and low-voltage transistors in the peripheral circuit under their respectively optimum conditions, and thereby again prevents deterioration of the transistor characteristics due to retraction of the buried insulating film in the peripheral circuit region.

In addition, the instant embodiment does not use ion implantation upon introducing phosphorus into the floating gates of memory cells. That is, phosphorus is doped into the second-layer polycrystalline silicon film when stacking it, and it is diffused by solid-phase diffusion into the first-layer polycrystalline silicon film forming the bottom layer of the floating gates. Therefore, damage to the tunnel oxide film and other adverse effects by channeling are prevented unlike the process relying on high-concentrated phosphorus ion implantation.

Furthermore, although both the floating gates in the cell array region and the gate electrodes of the peripheral circuit transistors have a two-layered polycrystalline silicon structure, since they are made under respectively optimum conditions for introducing impurities (conduction types and concentrations), stable write and erase properties of cell arrays, high performance of the peripheral circuit and high reliability of the flash memory are ensured.

Third Embodiment

Figure 23:
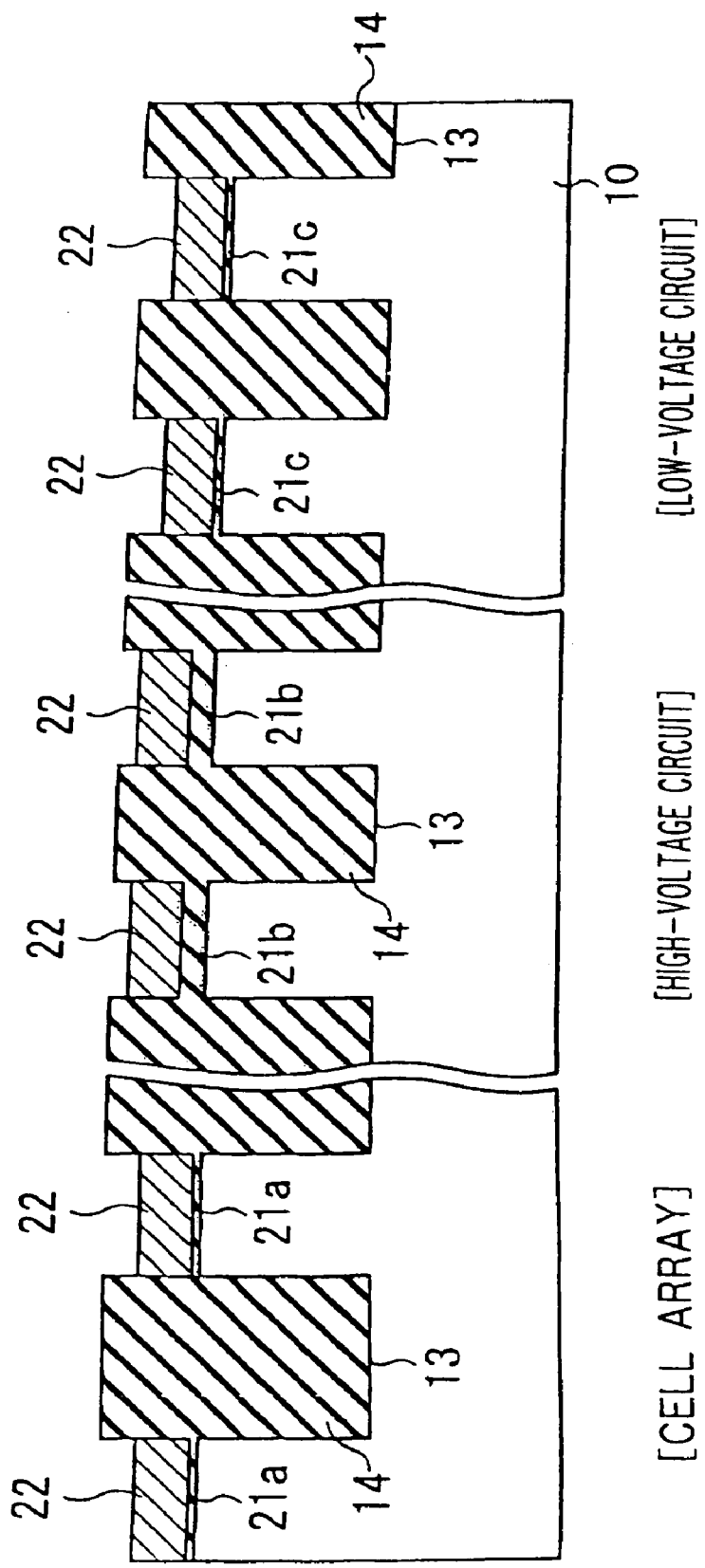
FIG. 23 is a cross-sectional view corresponding to FIG. 6, which shows a step in the third embodiment of the invention.

A further embodiment modified from the process of the first embodiment to separate floating gates in a self-aligned manner is explained with reference to FIGS. 23 through 28. The steps shown in FIGS. 1 through 6 are common to the instant embodiment. Although FIG. 23 corresponds to FIG. 6, the side configuration of the device isolation insulating film 14 in the instant embodiment preferably extends fully vertical, and FIG. 23 shows it as having vertically extending side surfaces.

Figure 24:
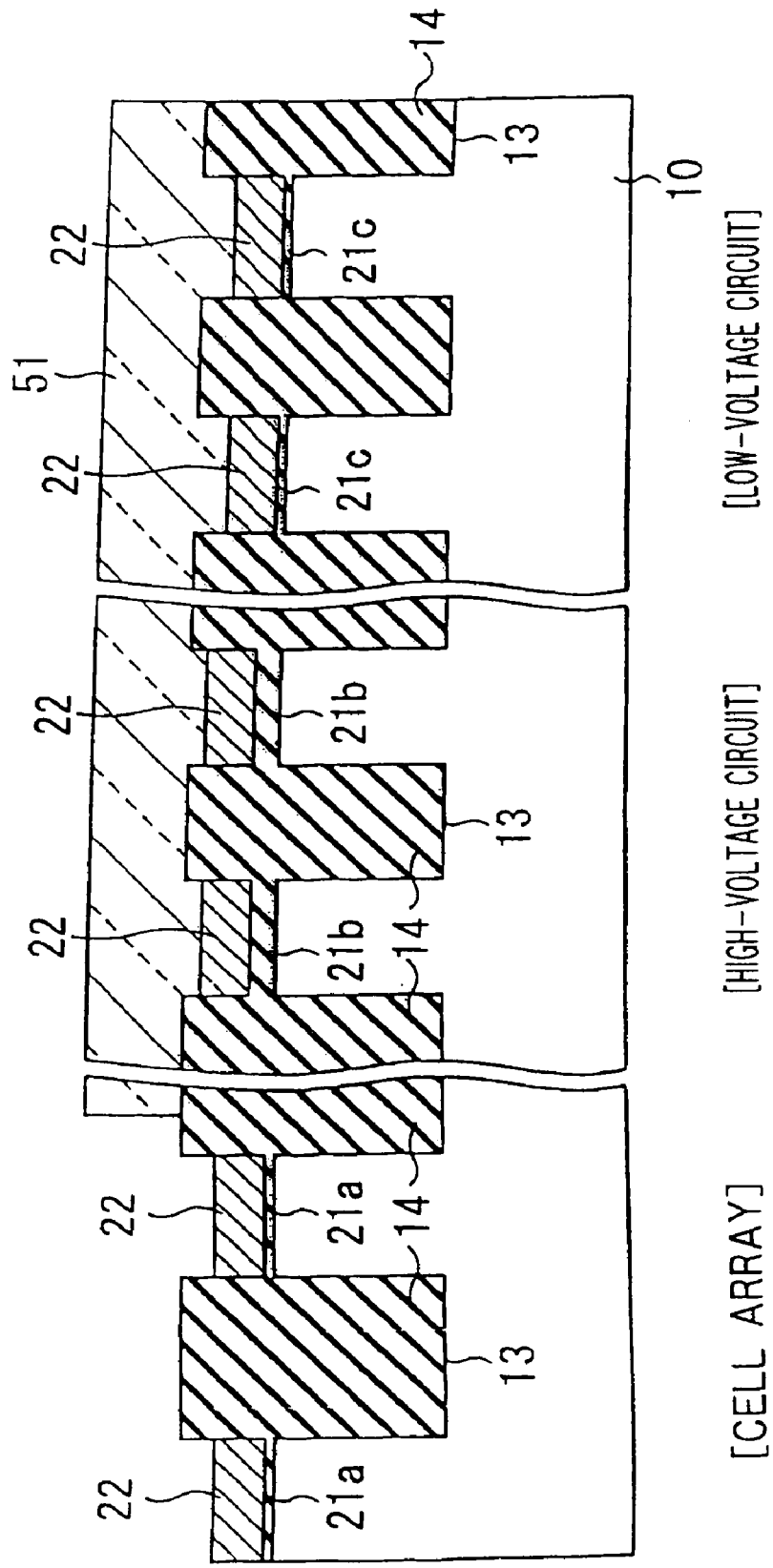
FIG. 24 is a cross-sectional view that shows a step of ion-implantation to the first-layer polycrystalline silicon film in the cell array region in the third embodiment.
Figure 25:
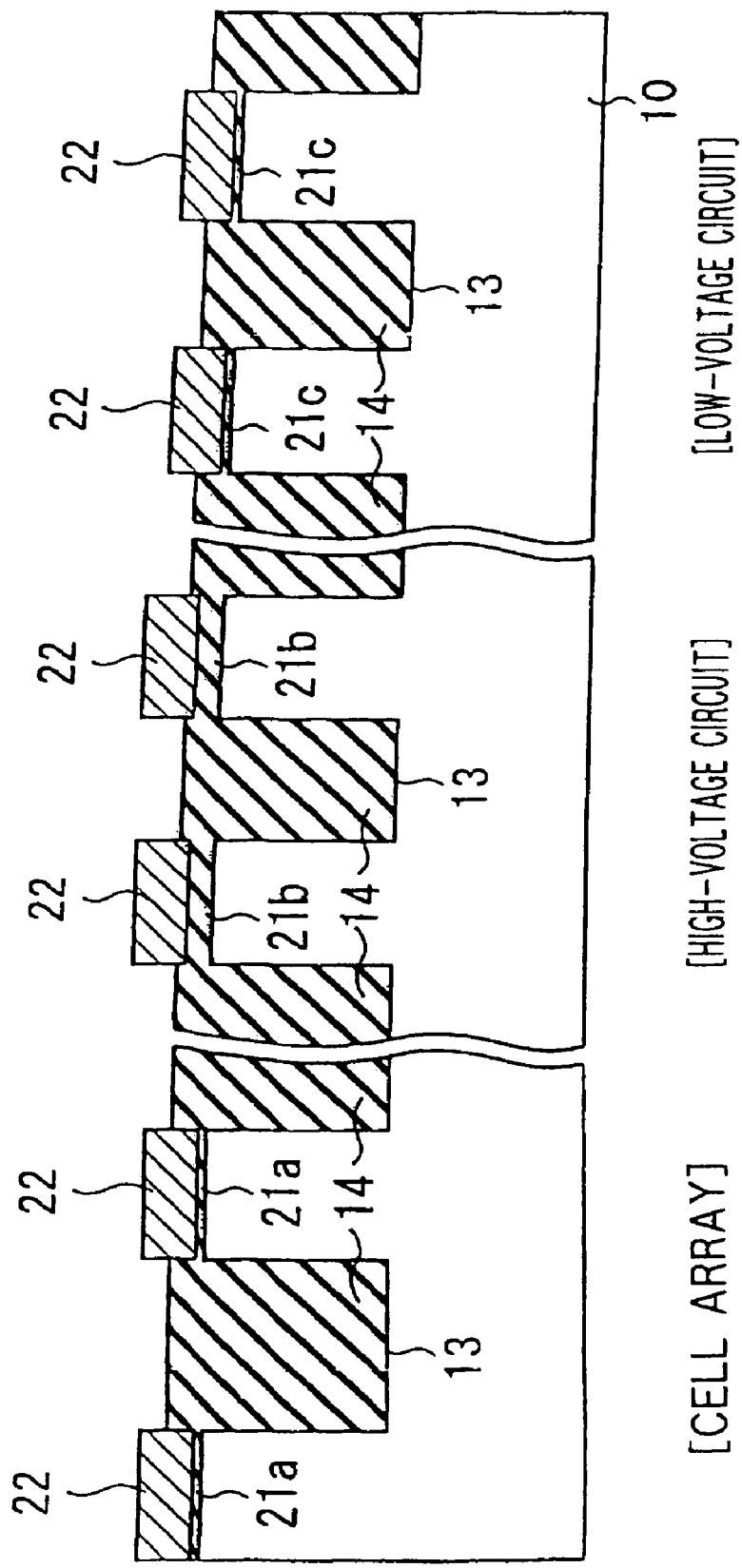
FIG. 25 is a cross-sectional view that shows a step of etching an oxide film in the third embodiment.
Figure 26:
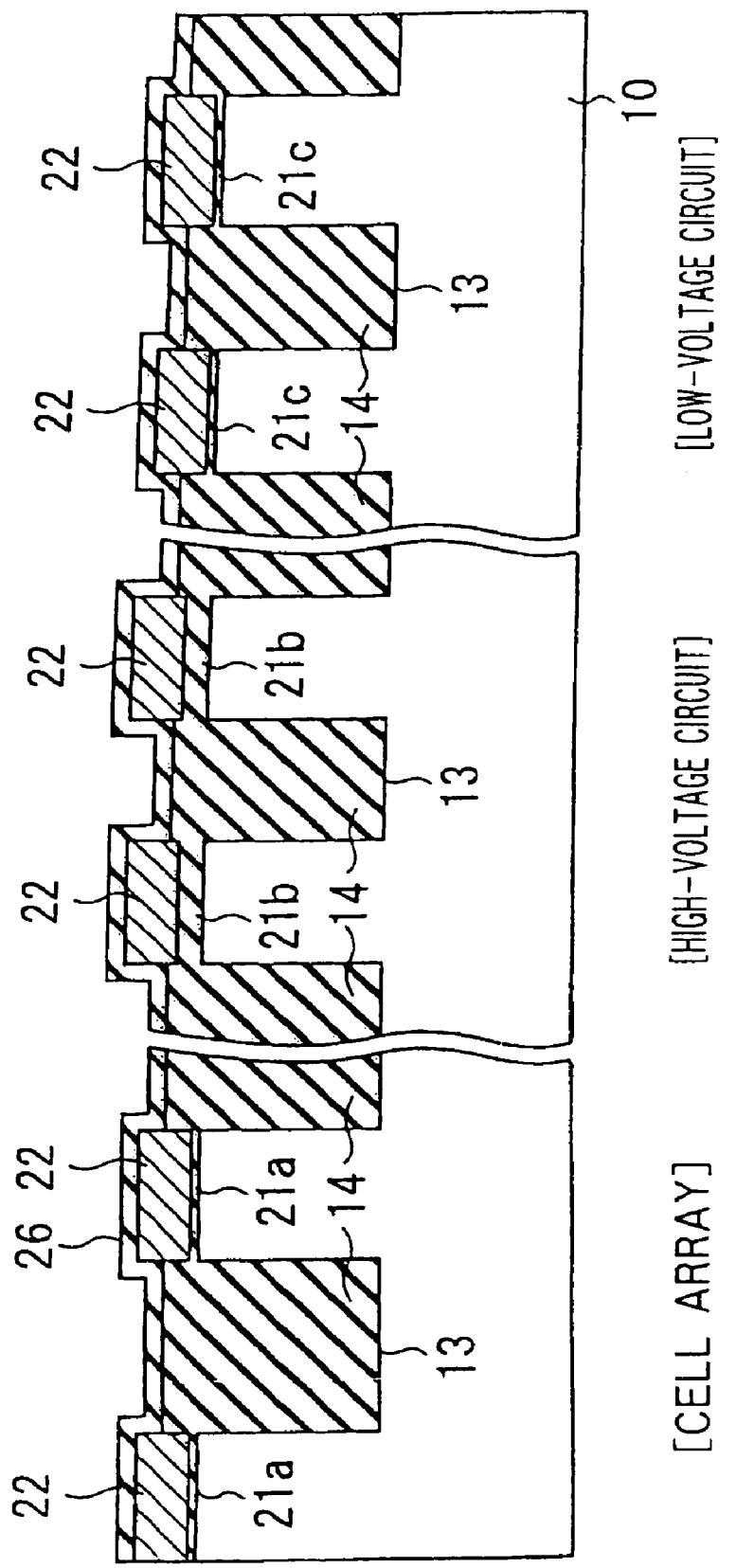
FIG. 26 is a cross-sectional view that shows a step of making a gate insulating film in the third embodiment.

After that, as shown in FIG. 24, a resist 51 having an aperture in the cell array region is formed by lithography, and phosphorus is ion-implanted into the first-layer polycrystalline silicon film 22, which will form floating gates in the cell array region. The device isolation insulating film 14 is next etched entirely to a level exposing side surfaces of the first-layer polycrystalline silicon film 22 as shown in FIG. 25. Subsequently, as shown in FIG. 26, the gate insulating film 26 in form of ONO film is formed.

Figure 27:
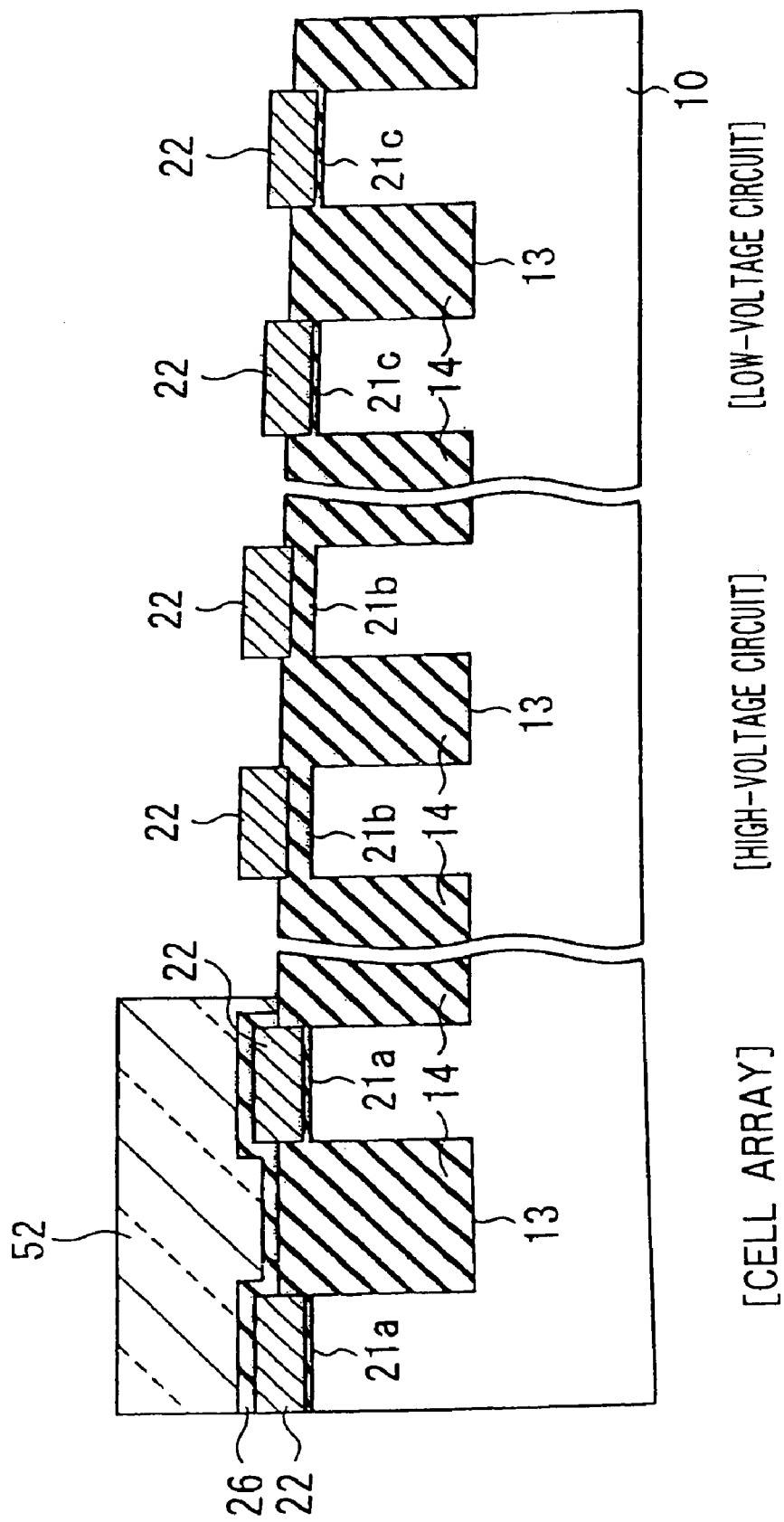
FIG. 27 is a cross-sectional view that shows a step of etching the gate insulating film in the peripheral circuit region in the third embodiment of the invention.
Figure 28:
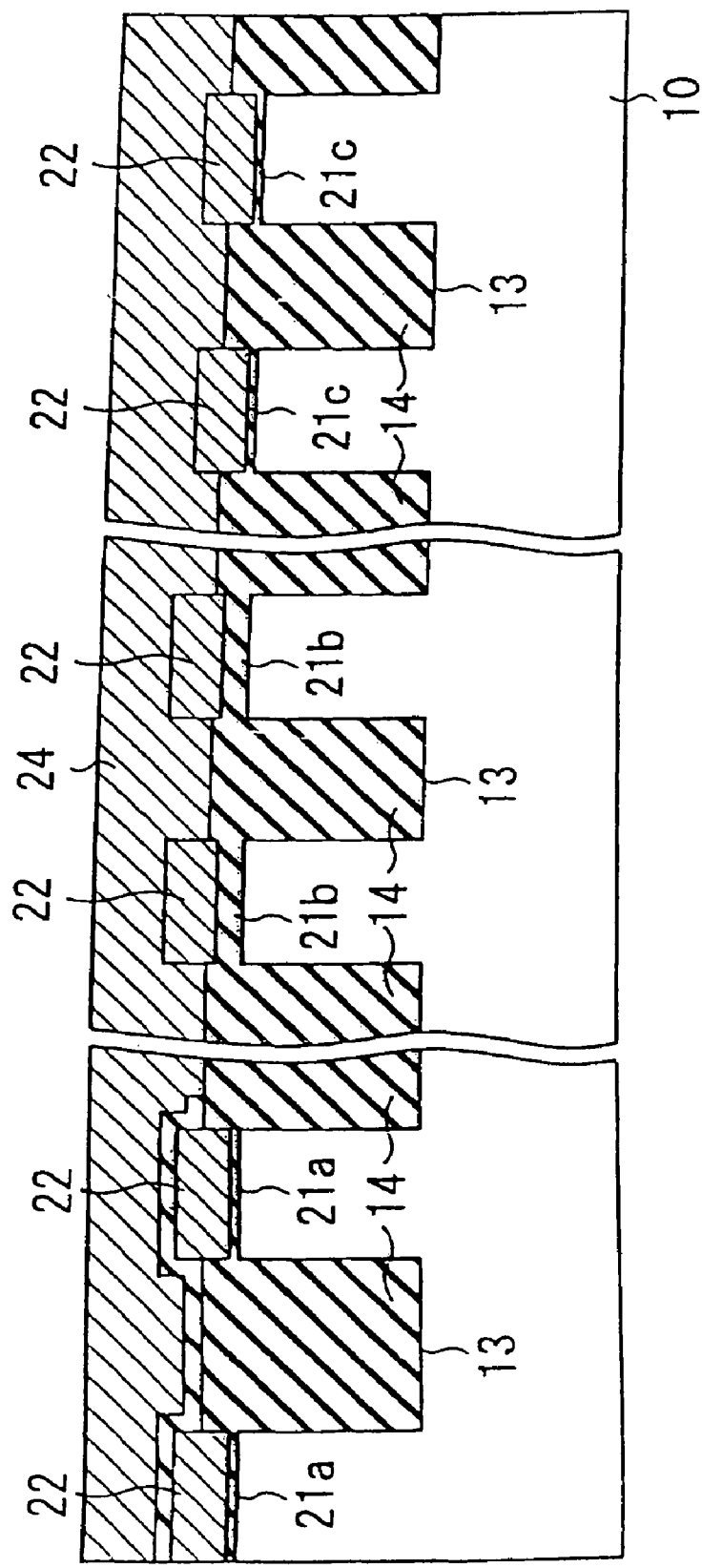
FIG. 28 is a cross-sectional view that shows a step of stacking a second-layer polycrystalline silicon film in the third 5 embodiment.

Next as shown in FIG. 27, a resist 52 is formed in a pattern having an aperture in the peripheral circuit region by lithography, and the gate insulating film 26 is removed by etching from the peripheral circuit region. Next as shown in FIG. 28, the polycrystalline silicon film 24 is stacked as a second-layer gate electrode material film on the entire surface. The polycrystalline silicon film 24 will form control gates in the cell array region, and will constitute, together with the first-layer polycrystalline silicon film 22, gate electrodes in the peripheral circuit region. Subsequent steps follow those of the first embodiment.

According to the instant embodiment, it is possible to not only integrate high-performance transistors in the peripheral circuit but also reduce the cell size in the cell array region because of isolation of floating gates comprising solely of the first-layer polycrystalline film 22 in a self-aligned manner. Additionally, although the floating gates made up of the first-layer polycrystalline silicon film 22 does not extend into the device isolation region, since the control gates are opposed also to their side surfaces, coupling capacitance between the control gates and the floating gates can be enhanced.

Fourth Embodiment

Figure 29:
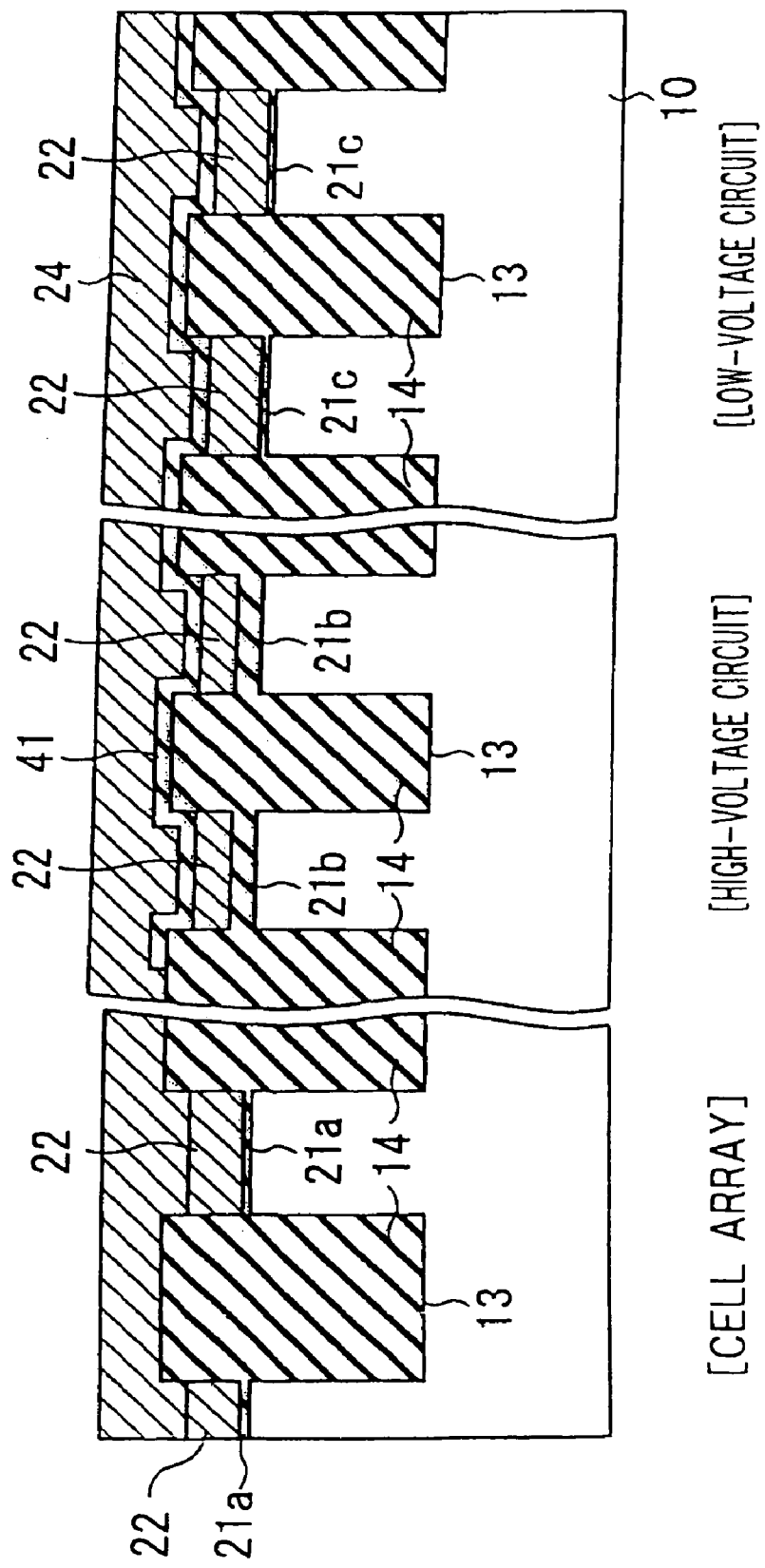
FIG. 29 is a cross-sectional view corresponding to FIG. 18, which shows a step in the fourth embodiment of the invention.

A further embodiment modified from the second embodiment to separate floating gates in a self-aligned manner is explained with reference to FIGS. 29 through 34. Steps of the second embodiment up to the step of FIG. 18 are common to the instant embodiment. Although FIG. 29 corresponds to FIG. 18, the side configuration of the device isolation insulating film 14 in the instant embodiment preferably extends fully vertical, and FIG. 29 shows it as having vertically extending side surfaces.

Figure 30:
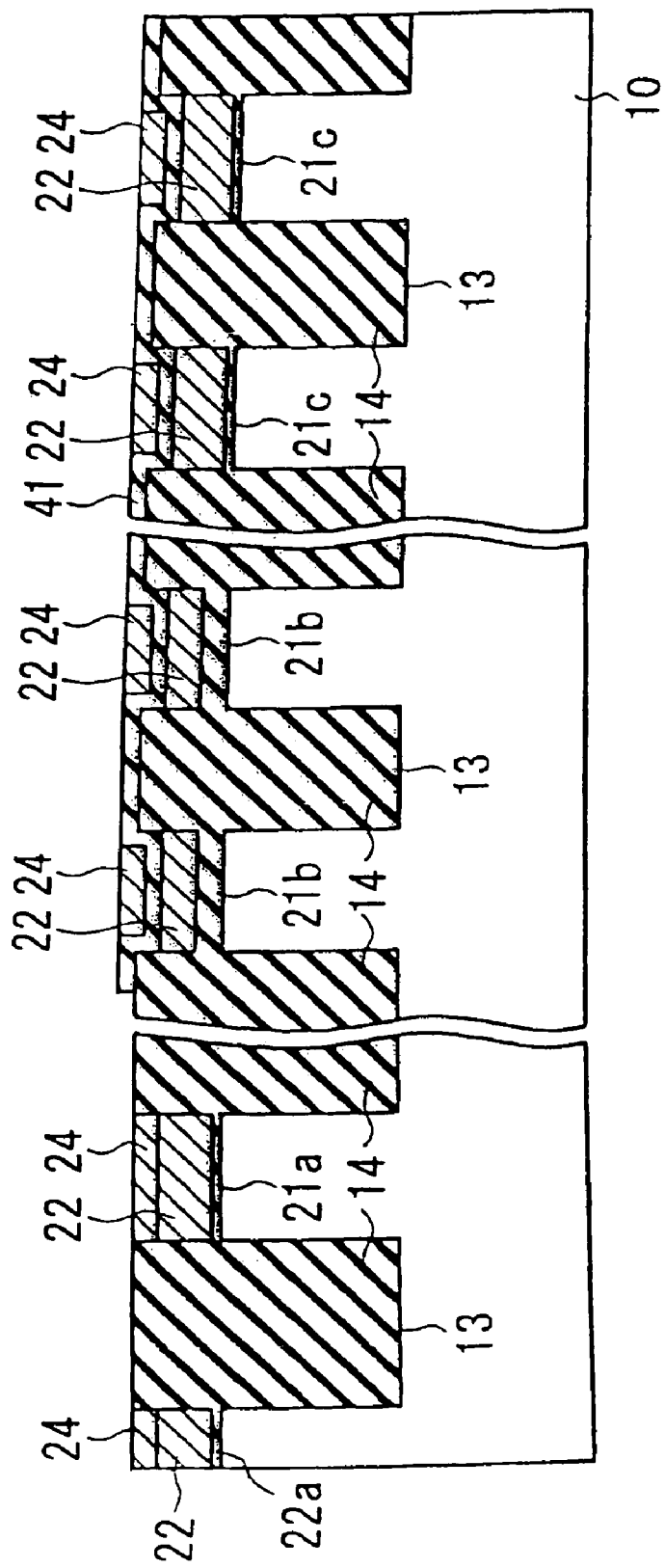
FIG. 30 is a cross-sectional view that shows a step of smoothing a second-layer polycrystalline silicon film in the fourth embodiment.
Figure 31:
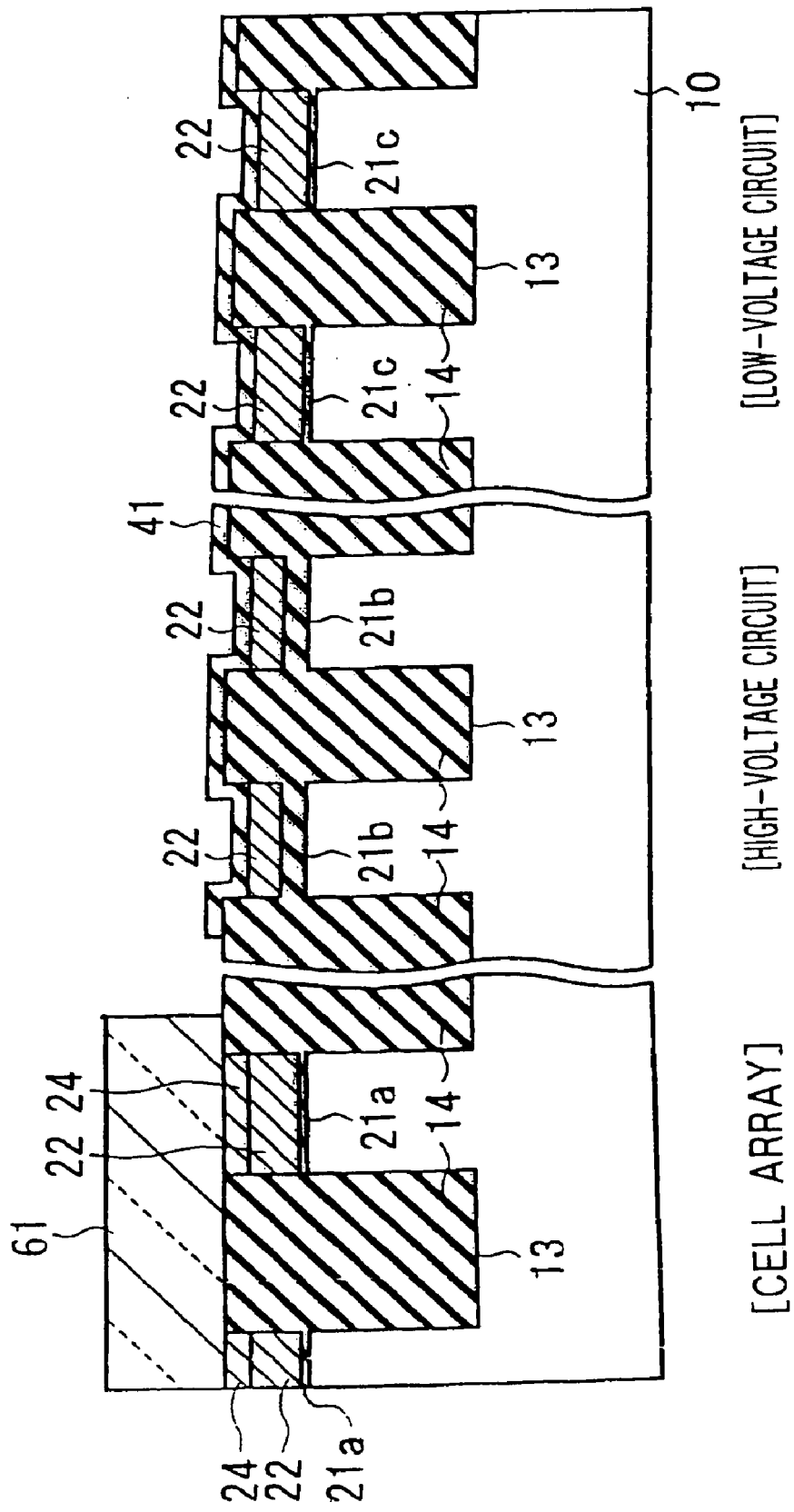
FIG. 31 is cross-sectional view that shows a step of etching the second-layer polycrystalline silicon film in the peripheral circuit region in the fourth embodiment.

After that, upper part of the second-layer polycrystalline silicon film 24 containing phosphorus is removed by CMP. As a result, as shown in FIG. 30, in the cell array region, the second-layer polycrystalline silicon film 24 is maintained in a self-aligned manner solely in the memory cell regions interposed between separate adjacent regions of the device isolation insulating film 14 and used together with the first-layer polycrystalline silicon film 22 to form floating gates. After that, as shown in FIG. 31, while covering the cell array region with a resist 61, the second-layer polycrystalline silicon film 24 still remaining the peripheral circuit region is removed by CDE (Chemical Dry Etching).

Figure 32:
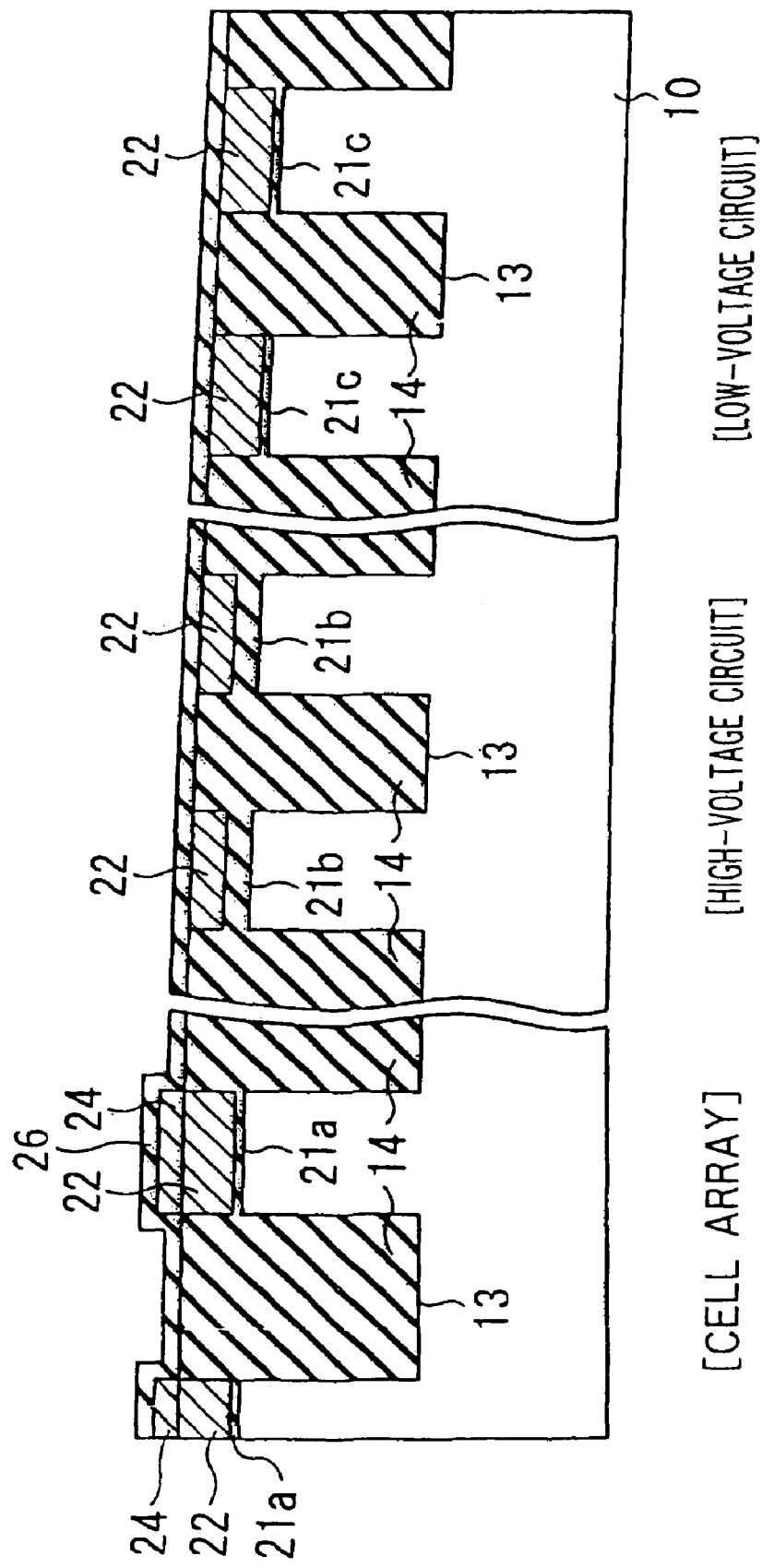
FIG. 32 is a cross-sectional view that shows a step of making a gate insulating film in the fourth embodiment.
Figure 33:
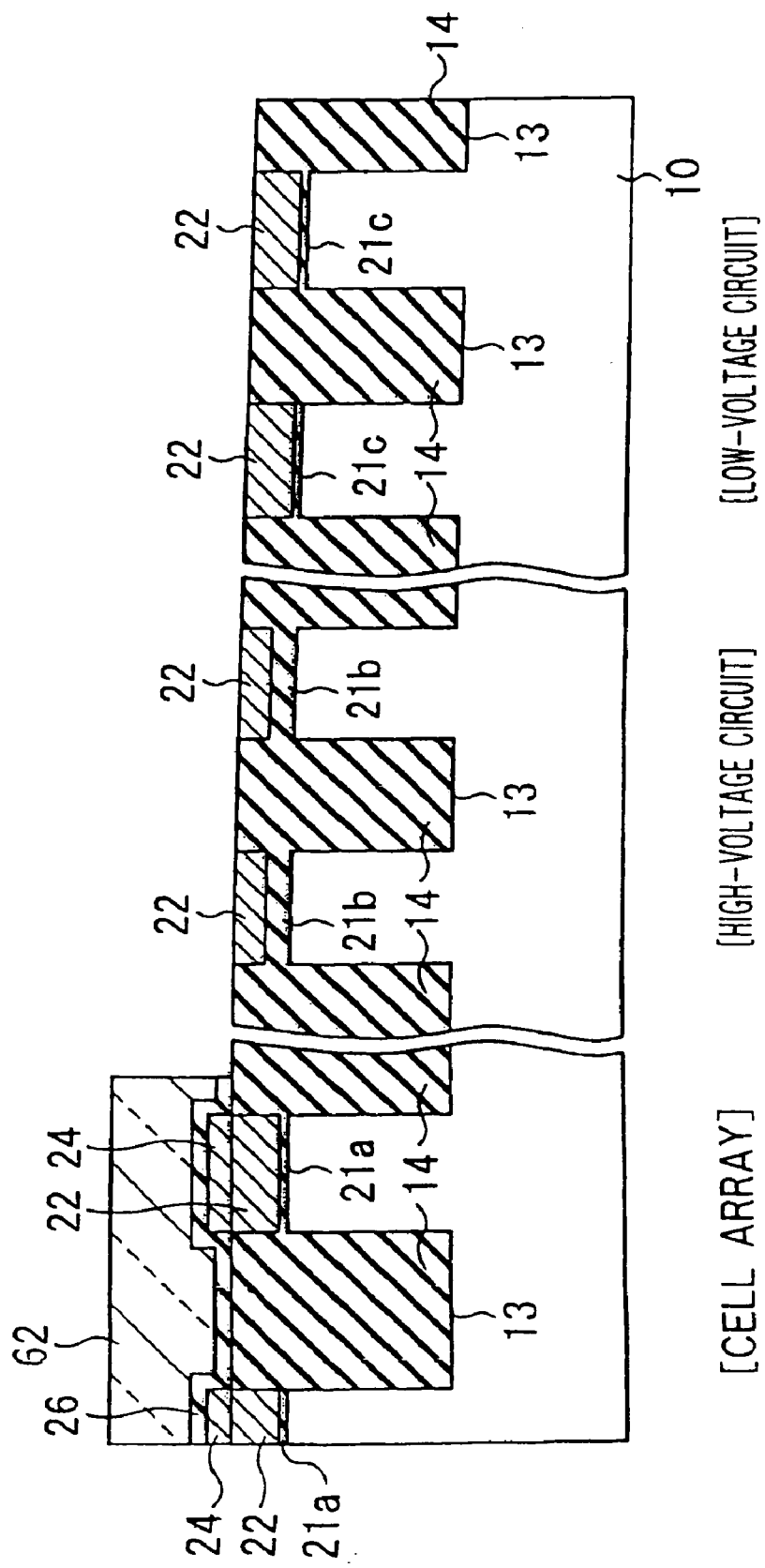
FIG. 33 is a cross-sectional view that shows a step of etching the gate insulating film in the peripheral circuit region in the fourth embodiment.
Figure 34:
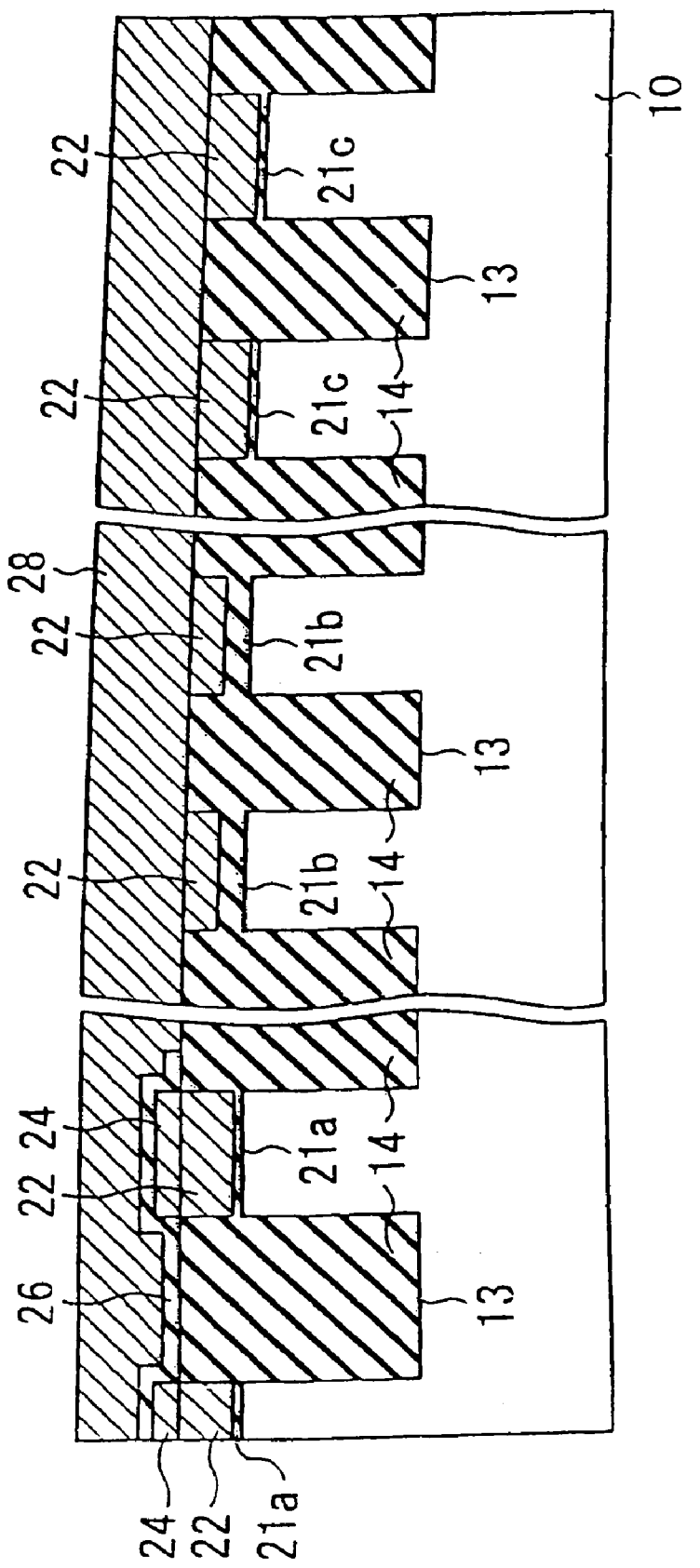
FIG. 34 is a cross-sectional view that shows a step of stacking a third-layer polycrystalline silicon film in the fourth embodiment.
Figure 35:
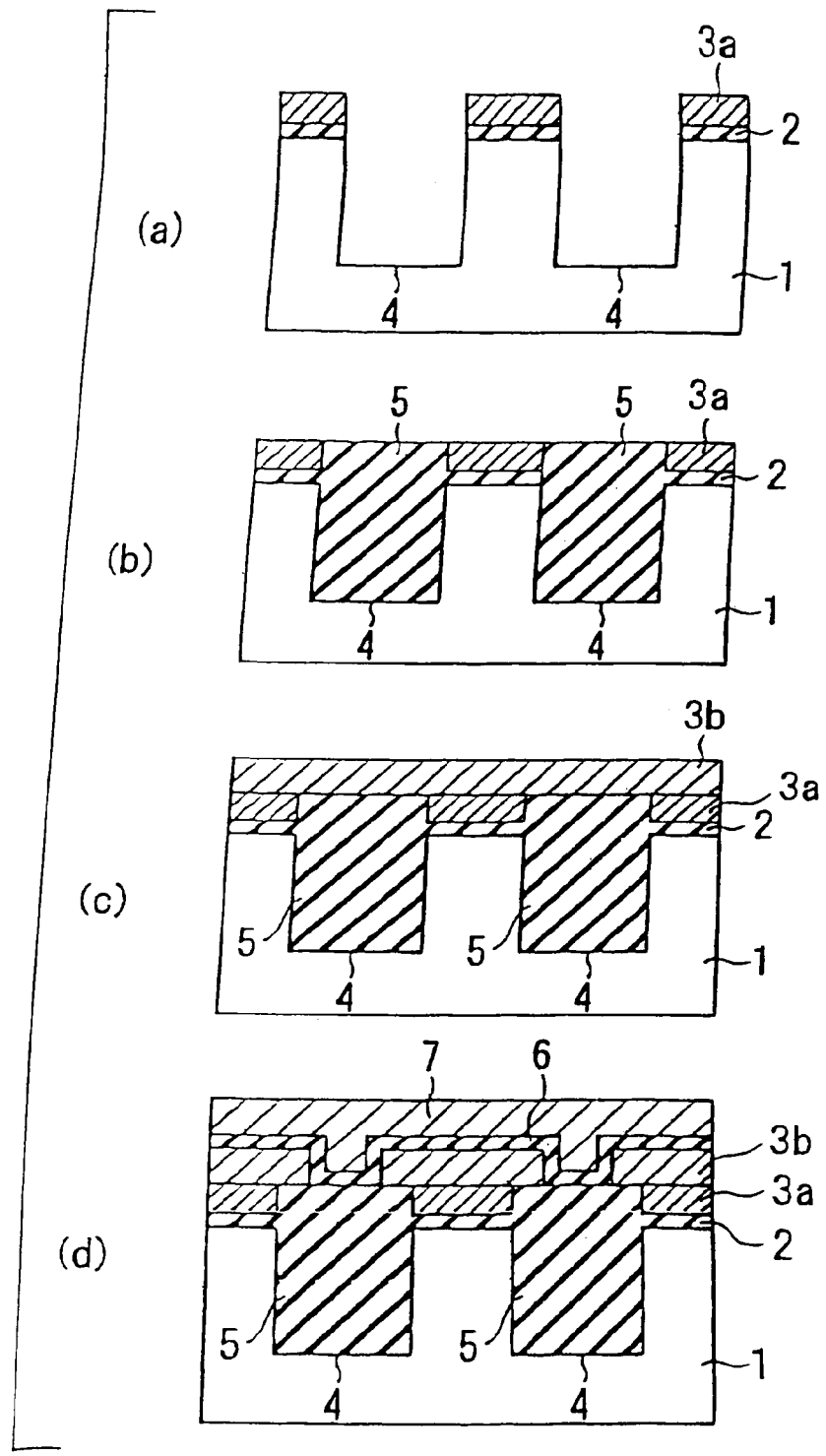
FIG. 35 is a cross-sectional view that shows a manufacturing process of a cell array section in conventional flash memory.
Figure 36:
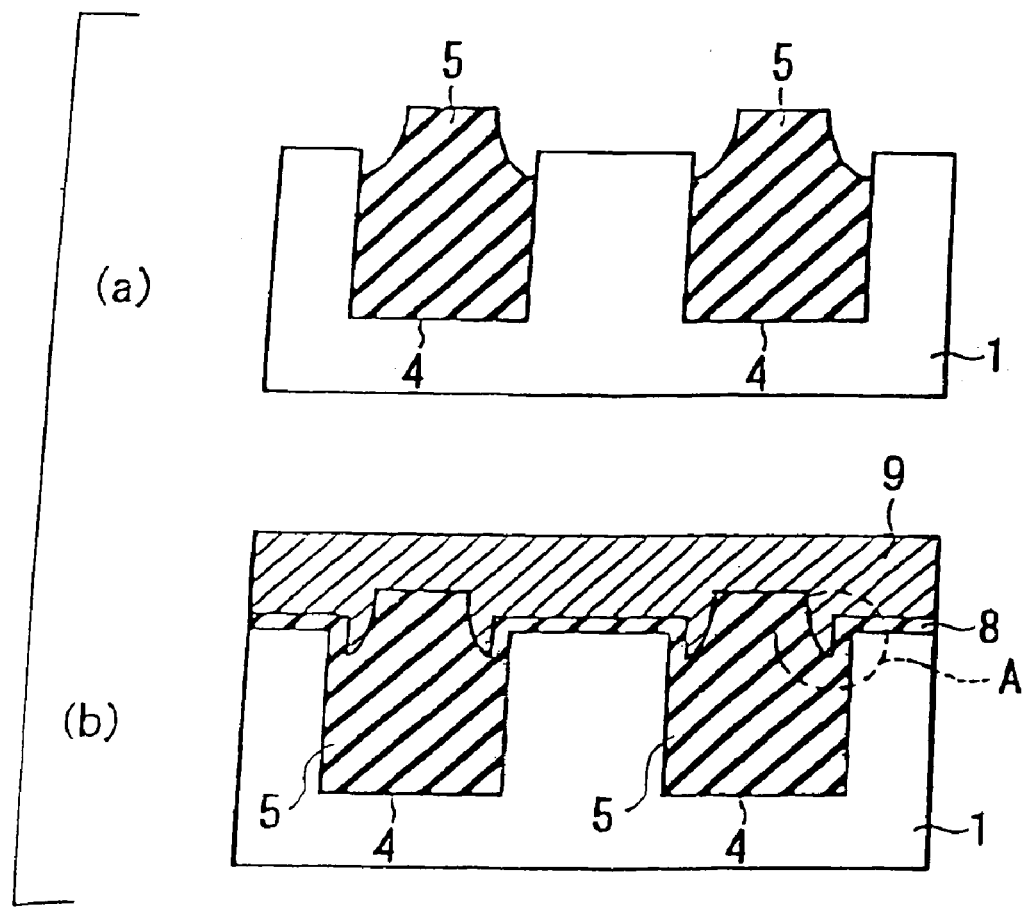
FIG. 36 is a diagram for explaining a problem with peripheral circuit transistors in the conventional flash memory.

Subsequently, the entire substrate surface undergoes etching of oxide films including the barrier film 41 and the device isolation insulating film 14 such that the top surface of the device isolation insulating film retracts in the cell array region at least until side surfaces of the second-layer polycrystalline silicon film 24 are exposed. Then as shown in FIG. 32, the gate insulating film 26, which is a ONO film, is formed for the purpose of separating floating gates and control gates of memory cells. Next as shown in FIG. 33, a resist 62 is formed to cover the cell array region by lithography, and the gate insulating film 26 is removed by etching from the peripheral region: Subsequently, as shown in FIG. 34, the third-layer polycrystalline silicon film 28 is stacked on the entire surface to form the control gates of the memory cells and partly form the gate electrodes of transistors of the peripheral circuit. Subsequent steps follow those of the second embodiment.

The instant embodiment also enables integration of high-performance transistors in the peripheral circuit and contributes to reduction of the cell size in the cell array region because of isolation of floating gates made of the first-layer polycrystalline silicon film 22 and the second-layer polycrystalline silicon film 24 in a self-aligned manner. Additionally, although the floating gates made of the first layer polycrystalline silicon film 22 and the second-layer polycrystalline silicon film 24 do not extend into the device isolation regions, since the control gates are opposed also to their side surfaces, coupling capacitance between the control gates and the floating gates can be enhanced.

The invention is not limited to the embodiments explained above. For example, although the foregoing embodiments have been explained as polycrystalline silicon films as gate electrode material films, amorphous silicon films may be used as an alternative.

As described above, according to the invention peripheral circuit transistors can be prevented from deterioration of properties due to retraction of the device isolation insulating film by first making the gate insulating film required in respective circuit regions before the step of isolating devices by STI such that the gate insulating film is covered by the bottom material layer of the gate electrodes. Moreover, by doping the floating gates in the cell array and the gate electrodes of transistors in the peripheral circuit region with impurities under respectively optimum conditions, high-performance flash memory can be obtained.

In the specification, polycrystalline Si has been referred to often as being non-doped, or being not doped, with impurities; however, it will be appreciated from the concept of the invention that such polycrystalline Si may be doped with impurities by a sufficient low concentration that the final doping concentration of impurities to the gate electrodes.

What is claimed is:

1. A method of manufacturing a non-volatile semiconductor memory device including a semiconductor substrate having a memory cell region and a peripheral circuit region, comprising:
    forming a first insulating film on the semiconductor substrate in the memory cell region and a second insulating film on the semiconductor substrate in the peripheral circuit region;
    forming a first conductive film on the first insulating film in the memory cell region and the second insulating film in the peripheral circuit region, the first conductive film having a first non-doped polycrystalline silicon film;
    forming device isolation regions in the memory cell region and the peripheral circuit region, each of the device isolation regions including an insulator having a lower portion embedded in the semiconductor substrate and an upper portion protruding from an upper surface of the semiconductor substrate, respectively;
    implanting impurities in the first conductive film of the memory cell region without implanting the impurities in the first conductive film of the peripheral circuit region;
    forming an inter-gate insulating film on the impurities-doped first conductive film in the memory cell region without forming the inter-gate insulating film on the non-doped first conductive film in the peripheral circuit region; and
    forming a second conductive film on the inter-gate insulating film in the memory cell region and on the non-doped first conductive film in the peripheral circuit region,
    wherein the second conductive film has a second non-doped polycrystalline silicon film.

2. The method of claim 1, wherein the impurities include phosphorus.

3. The method of claim 1, wherein a thickness of the first insulating film in the memory cell region is smaller than a thickness of the second insulating film in the peripheral circuit region.

4. The method of claim 1 further comprising forming a salicide film on the second conductive film.

5. A method of manufacturing a non-volatile semiconductor memory device including a semiconductor substrate having a memory cell region and a peripheral circuit region, comprising:
    forming a first insulating film formed on the semiconductor substrate in the memory cell region and a second insulating film on the semiconductor substrate in the peripheral circuit region;
    forming a first conductive film on the first insulating film in the memory cell region and the second insulating film in the peripheral circuit region, the first conductive film having a first non-doped polycrystalline silicon film;
    forming device isolation regions in the memory cell region and the peripheral circuit region, each of the device isolation regions including an insulator having a lower portion embedded in the semiconductor substrate and an upper portion protruding from an upper surface of the semiconductor substrate, respectively;
    implanting impurities in the first conductive film of the memory cell region without implanting the impurities in the first conductive film of the peripheral circuit region;
    forming an inter-gate insulating film on the impurities-doped first conductive film in the memory cell region and the non-doped first conductive film in the peripheral circuit region;
    removing the inter-gate insulating film in the peripheral circuit region while leaving the inter-gate insulating film in the memory cell region; and
    forming a second conductive film on the inter-gate insulating film in the memory cell region and on the non-doped first conductive film in the peripheral circuit region,
    wherein the second conductive film has a second non-doped polycrystalline silicon film.

6. The method of claim 5, wherein the impurities include phosphorus.

7. The method of claim 5, wherein a thickness of the first insulating film in the memory cell region is smaller than a thickness of the second insulating film in the peripheral circuit region.

8. The method of claim 5 further comprising forming a salicide film on the second conductive film.

9. A method of manufacturing a non-volatile semiconductor memory device including a semiconductor substrate having a memory cell region and a peripheral circuit region, comprising:

forming a first insulating film on the semiconductor substrate in the memory cell region and a second insulating film on the semiconductor substrate in the peripheral circuit region;

forming a first conductive film on the first insulating film in the memory cell region and the second insulating film in the peripheral circuit region, the first conductive film having a first non-doped polycrystalline silicon film;

forming device isolation regions in the memory cell region and the peripheral circuit region, each of the device isolation regions including an insulator having a lower portion embedded in the semiconductor substrate and an upper portion protruding from an upper surface of the semiconductor substrate, a height of the insulator being higher than a height of the first conductive film relative to the upper surface of the semiconductor substrate, respectively;

implanting impurities in the first conductive film of the memory cell region without implanting the impurities in the first conductive film of the peripheral circuit region;

etching the insulator so that a height of the insulator is lower than the height of the first conductive film relative to the upper surface of the semiconductor substrate;

forming an inter-gate insulating film on the impurities-doped first conductive film in the memory cell region and the non-doped first conductive film in the peripheral circuit region;

removing the inter-gate insulating film in the peripheral circuit region while leaving the inter-gate insulating film in the memory cell region; and forming a second conductive film on the inter-gate insulating film in the memory cell region and on the non-doped first conductive film in the peripheral circuit region, wherein the second conductive film has a second non-doped polycrystalline silicon film.

10. The method of claim 4, wherein the impurities include phosphorus.

11. The method of claim 4, wherein a thickness of the first insulating film in the memory cell region is smaller than a thickness of the second insulating film in the peripheral circuit region.

12. The method of claim 4 further comprising forming a salicide film on the second conductive film.

* * * * *